US012234545B2

(12) United States Patent
Ma

(10) Patent No.: US 12,234,545 B2
(45) Date of Patent: Feb. 25, 2025

(54) PLASMA SOURCE ION IMPLANTER WITH PREPARATION CHAMBER FOR LINEAR OR CROSS TRANSFERRING WORKPIECE

(71) Applicant: Harbin Institute of Technology, Harbin (CN)

(72) Inventor: Xinxin Ma, Harbin (CN)

( * ) Notice: Subject to any disclaimer, the term of this patent is extended or adjusted under 35 U.S.C. 154(b) by 406 days.

(21) Appl. No.: 17/935,035

(22) Filed: Sep. 23, 2022

(65) Prior Publication Data

US 2023/0092691 A1 Mar. 23, 2023

(30) Foreign Application Priority Data

Sep. 23, 2021 (CN) .......................... 202111115246.X

(51) Int. Cl.
*C23C 14/48* (2006.01)
*C23C 14/02* (2006.01)

(52) U.S. Cl.
CPC ............ *C23C 14/48* (2013.01); *C23C 14/021* (2013.01)

(58) Field of Classification Search
None
See application file for complete search history.

(56) References Cited

U.S. PATENT DOCUMENTS

| 5,654,043 | A | * | 8/1997 | Shao | ....................... C23C 14/48 427/523 |
| 2001/0029896 | A1 | * | 10/2001 | Neidhardt | ............... C23C 14/48 118/730 |
| 2004/0211356 | A1 | * | 10/2004 | Yamazaki | ............... C23C 14/48 117/84 |
| 2011/0163065 | A1 | * | 7/2011 | Verhaverbeke | ... H01L 21/67766 427/127 |
| 2022/0228254 | A1 | * | 7/2022 | Matsumoto | ............. C23C 14/30 |

FOREIGN PATENT DOCUMENTS

WO WO-2013149572 A1 * 10/2013 ......... C23C 14/0605

* cited by examiner

*Primary Examiner* — Jason Berman
(74) *Attorney, Agent, or Firm* — Novoclaims Patent Services LLC; Mei Lin Wong

(57) ABSTRACT

A plasma source ion implanter with a preparation chamber for linear or cross transferring workpiece is provided to solve the problem of low production efficiency of an existing single vacuum chamber plasma source ion implanter. The ion implanter includes a preparation chamber, an implantation chamber and a workpiece transferring chamber. The implantation chamber is provided to maintain a high vacuum condition all the time, and the time for pre-vacuuming the base vacuum is ignored. The ion implanter with dual chamber configuration is able to greatly shorten the production cycle. The structural configurations of the preparation chamber and the implantation chamber are basically the same, and are adapted to be used independently when ion implantation is required for a long time.

10 Claims, 4 Drawing Sheets

PLASMA SOURCE ION IMPLANTER WITH PREPARATION CHAMBER FOR LINEAR OR CROSS TRANSFERRING WORKPIECE

CROSS REFERENCE OF RELATED APPLICATION

This is a non-provisional application that claims priority to a Chinese application, application number CN 202111115246A, filed on Sep. 23, 2021, the entire contents of which is expressly incorporated herein by reference.

BACKGROUND OF THE PRESENT INVENTION

Field of Invention

The present invention relates to a plasma source ion implanter.

Description of Related Arts

Plasma source ion implantation technology has been widely used as it was developed. Compared with beamline ion implantation, plasma source ion implantation has the characteristics of omnidirectional, large area and batch processing. Plasma source ion implantation is arranged to form a sheath around the workpiece during the implantation process in order to provide enough acceleration space for the implanted ions. The workpieces in the plasma source ion implanter are generally far away due to the large size of the sheath. The workpiece is generally rotated for achieving a uniform implantation. Due to the high energy of ions during ion implantation, i.e. usually 10-100 keV, a large working space is formed between a workbench and the surrounding walls of the plasma source ion implanter for ensuring electrical insulation. However, such factors will cause the limited effective working space and low load of the plasma source ion implanter.

In order to obtain a high-quality implantation result and to prevent the surface oxidation caused by the implantation of impurity elements or the implantation temperature increase, the plasma source ion implantation is incorporated with a high vacuum system, wherein its base vacuum value is set at $10^{-4}$ Pa. In order to obtain a high base vacuum, the system takes a lot of time to pre-pump the base vacuum before the ion implantation. Meanwhile, it is necessary to perform surface degassing and ion sputtering cleaning pretreatment on the workpiece in order to obtain a clean workpiece surface. Generally, the time of ion implantation will take several hours, and the time of evacuation and pretreatment is much longer than the effective implantation time. Currently, the plasma source ion implanter mainly incorporates a single vacuum chamber system via a periodic production method. Since the pre-evacuation time is relatively long, the production efficiency is low. Accordingly, it is an urgent problem to be solved in mass production.

SUMMARY OF THE PRESENT INVENTION

In order to solve the problem of low production efficiency of an existing single vacuum chamber plasma source ion implanter, the present invention provides a plasma source ion implanter with a dual chamber configuration and its ion implantation method.

The present invention provides a plasma source ion implanter with a preparation chamber for linear transferring workpiece comprises a preparation chamber 1, an implantation chamber 2 and a workpiece transferring chamber 3.

The preparation chamber 1 is constructed with a double-layer wall having a double-wall structure defining an inner cavity, and a water inlet pipe and a water outlet pipe are arranged on the double-layer wall, wherein the preparation chamber 1 is operatively connected to a vacuum pumping system. The preparation chamber 1 is arranged for pre-vacuuming, degassing and surface ion cleaning of the workpiece. The ion implanter further comprises a first workbench 10 rotatably disposed in the preparation chamber 1, and a plurality of first stations 14 radially provided on the first workbench 10 at a position that the first stations 14 are arranged in a circular array. The ion implanter further comprises a first telescopic support member 18 having a rod shape, wherein an upper end portion of the first telescopic support rod 18 is extended to pass through a through hole formed at the first workbench 10 below the first station 14 to perpendicularly extend to the first workbench 10. A power switching device has an output end connecting to the first workbench 10 via electrodes, and input ends respectively connecting with the negative poles of the cleaning power supply and the implantation power supply. The wall of the preparation chamber 1 is connected to the positive pole of the cleaning power supply and the implantation power supply, wherein a baking system and a radio frequency antenna are disposed in the preparation chamber 1. The radio frequency antenna is connected to the radio frequency power supply outside the preparation chamber 1. A first workbench drive motor 101 is located outside of the preparation chamber 1 for driving the first workbench 10 to rotate.

The above-mentioned vacuum pumping system, which is connected with the preparation chamber 1, comprises a vacuum pumping device and a gas intake device, wherein the vacuum pumping device is connected to a first exhaust outlet 7 provided on the preparation chamber 1, and the gas intake device is connected to a first gas inlet 12 provided on the preparation chamber 1. The first exhaust outlet 7 and the first gas inlet 12 are positioned opposite to each other to prevent the gas from short-circuiting. The gas intake device is arranged to deliver the working gas to the interior of the preparation chamber 1.

The implantation chamber 2 is also constructed with double-layer wall having a double-wall structure defining an inner cavity, and a water inlet pipe and a water outlet pipe are arranged on the double-layer wall, wherein the implantation chamber 1 is operatively connected to the vacuum pumping system. The implantation chamber 2 is arranged to perform ion implantation and maintain a high vacuum condition. The ion implanter further comprises a second workbench 11 rotatably disposed in the implantation chamber 2, and a plurality of second stations 15 radially provided on the second workbench 11 at a position that the second stations 15 are arranged in a circular array. The number of the second stations 15 on the implantation chamber 2 is less than the number of the first stations 14 on the preparation chamber 1. The ion implanter further comprises a second telescopic support member 19 having a rod shape, wherein an upper end portion of the second telescopic support rod 19 is extended to pass through a through hole formed at the second workbench 11 below the second station 15 to perpendicularly extend to the second workbench 11. The second workbench 11 is connected with the output end of the power switching device via the electrodes, while the input ends of the power switching device are respectively connected with the negative poles of the cleaning power supply and the implantation power supply. The wall of the implantation chamber 2 is connected to the positive poles of the cleaning power supply and the implantation power supply, wherein the baking system and the radio frequency antenna are disposed at an upper portion of the implantation chamber 2. The radio frequency antenna is connected to the radio frequency power supply outside the implantation chamber 2. A second table drive motor 111 is located outside of the implantation chamber 2 for driving the second table 11 to rotate.

The above-mentioned vacuum pumping system, which is connected with the implantation chamber 2, comprises a vacuum pumping device and a gas intake device. The vacuum pumping device is connected with a second exhaust outlet 8 provided on the implantation chamber 2, and the gas inlet device is connected with the second gas inlet 13 provided on the implantation chamber 2. The second exhaust outlet 8 and the second gas inlet 13 are positioned opposite to each other to prevent the gas from short-circuiting. The gas intake device is arranged to deliver the working gas to the interior of the implantation chamber 2.

The baking system disposed in the preparation chamber 1 and the implantation chamber 2 is arranged for baking and degassing the workpiece, and combining with ion bombardment cleaning to accelerate the degassing effect on the surface of the workpiece. The radio frequency antenna is arranged to excite plasma in the vacuum chamber, widen the discharge pressure range when cleaning the workpiece, reduce the difficulty of ion bombardment cleaning and discharge, reduce the phenomenon of arc discharge, and improve the cleaning quality. An ion source is provided for ion implantation during implantation. When the cleaning power supply is connected to the workbench, a glow discharge will be generated under the appropriate pressure wherein the glow discharge will cause gas ionization to form positive ions, which can bombard the workpiece at the cathode to generate a cleaning effect. When the implantation power supply is connected to the workbench, it is arranged to accelerate the positive ions in the plasma generated by the radio frequency power supply, and the high-energy ions enter the surface of the workpiece to achieve ion implantation.

The preparation chamber 1 and the implantation chamber 2 are connected with each other through the workpiece transferring chamber 3, wherein the preparation chamber 1 and the implantation chamber 2 are symmetrically arranged on two opposed sides of the workpiece transferring chamber 3, such that the preparation chamber 1 and the implantation chamber 2 are linearly aligned with each other. A vacuum gate valve 6 is operatively provided at a center of the workpiece transferring chamber 3. The workpiece transferring chamber 3 comprises first and second transferring platforms 20, 21 provided at a mid-portion of the workpiece transferring chamber 3, wherein the first transferring platform 20 is located at one side of the vacuum gate valve 6 while the second transferring platform 21 is located at the opposed side of the vacuum gate valve 6. In other words, the vacuum gate valve 6 is located between the first and second transferring platforms 20, 21 of the workpiece transferring chamber 3. A transferring rod 17 is provided on the left side of the preparation chamber 1, wherein the first telescopic support member 18 is provided below the first worktable 10 while the second telescopic support member 19 is provided below the second worktable 11.

The method of ion implantation by using plasma source ion implanter with a preparation chamber for linear transferring workpiece comprises the following steps.

Step 1: Close an implantation chamber 2, close a vacuum gate valve 6, and pre-vacuum the implantation chamber 2 until a vacuum value thereof reaches at least $10^{-2}$ Pa, turn on a baking system in the implantation chamber 2 and pass hot water into a double-layer wall thereof for heating and degassing, and then vacuumize the implantation chamber 2 until a base vacuum value thereof reaches at least $10^{-4}$ Pa.

Step 2: While pre-evacuating the implantation chamber 2, open the preparation chamber 1 to place the workpiece.

Step 3: Workpiece preprocess:

Close a preparation chamber 1, pre-vacuum the preparation chamber 1 until a base vacuum value thereof reaches at least $10^{-2}$ Pa, turn on the baking system in the preparation chamber 1 and pass hot water into a double-layer wall thereof for heating and degassing, then vacuumize the preparation chamber 1 until the base vacuum value thereof is less than $5\times10^{-3}$ Pa, and feed working gas to the first gas inlet 12 through the gas intake device to a preset vacuum value. After the working gas is introduced, decrease the vacuum value, wherein the vacuum value is set at 1-100 Pa. Turn on a radio frequency power supply of the preparation chamber 1 to excite a radio frequency antenna to generate plasma, and turn on a cleaning power supply corresponding to the preparation chamber 1 to form an ion bombardment cleaning. The cleaning power supply can form a negative voltage on the workpiece to accelerate the positive ions ionized in the vacuum and bombard the surface of the workpiece with positive ions with energy, so as to remove the residual gas and pollutants adsorbed on the surface. Then, after cleaning, stop feeding the working gas and continue to vacuum until the base vacuum value of the preparation chamber 1 is less than $5\times10^{-3}$ Pa.

Step 4: Connect the preparation chamber 1 and the implantation chamber 2:

After the preparation chamber 1 reaches the required base vacuum value, open the vacuum gate valve 6. Since the preparation chamber 1 and the implantation chamber 2 are both high vacuum condition at this time, there is no significant effect when the vacuum gate valve 6 is opened even though there is a difference in vacuum value therebetween.

Step 5: Transfer the workpiece:

When transferring the workpiece, operate the first telescopic support member 18 or the second telescopic support member 19 to lift the workpiece on the first station 14 or the second station 15, then operate the transferring rod 17 to linearly move to extend a front end thereof under the workpiece, lower the first telescopic support member 18 or the second telescopic support member 19, completes picking up the workpiece, and transfer the workpiece between the first station 14 and the second station 15. The first and second transferring platforms 20, 21 are arranged to temporarily support the transferring rod 17.

Step 6: Ion implantation:

Close the vacuum gate valve 6, continue to vacuum the implantation chamber 2 until the vacuum value in the implantation chamber 2 reaches the required base vacuum value, then introduce the working gas into the implantation chamber 2, turn on the radio frequency power supply and the implantation power supply corresponding to the implantation chamber 2 to perform ion implantation.

Step 7: Pre-cleaning a new batch of workpiece:

During the ion implantation in the implantation chamber 2, introduce the working gas into the preparation chamber 1 through the gas take device, open the preparation chamber 1, reload a new batch of workpiece and preprocess the workpieces according to step 3.

Step 8: Ion implantation of the new batch of workpiece:

After the workpiece ion implantation in the implantation chamber 2 is completed, open the vacuum gate valve 6, operate the transferring rod 17 to linearly move to replace the workpiece in the preparation chamber 1 and the implantation chamber 2. Since the number of stations in the preparation room 1 is more than that in the implantation room 2, the excess stations can be used as temporary stations for replacement.

Step 9: Close the vacuum gate valve 6 and perform the ion implantation in the implantation chamber 2.

Step 10: Inflate the preparation chamber 1, open the preparation chamber 1, take out the implanted workpiece, and put in a new workpiece.

The present invention further provides a plasma source ion implanter with a preparation chamber for cross transferring workpiece according to this embodiment comprises a preparation chamber 1, an implantation chamber 2 and a workpiece transferring chamber 3.

The preparation chamber 1 is constructed with a double-layer wall, and a water inlet pipe and a water outlet pipe are arranged on the double-layer wall, wherein the preparation chamber 1 is operatively connected to a vacuum pumping system. The preparation chamber 1 is arranged for pre-vacuuming, degassing and surface ion cleaning of the workpiece. The ion implanter further comprises a first workbench 10 rotatably disposed in the preparation chamber 1, and a plurality of first stations 14 radially provided on the first workbench 10 at a position that the first stations 14 are arranged in a circular array. A power switching device has an output end connecting to the first workbench 10 via electrodes, and input ends respectively connecting with the negative poles of the cleaning power supply and the implantation power supply. The wall of the preparation chamber 1 is connected to the positive pole of the cleaning power supply and the implantation power supply, wherein a baking system and a radio frequency antenna are disposed in the preparation chamber 1. The radio frequency antenna is connected to the radio frequency power supply outside the preparation chamber 1. A first workbench drive motor 101 is located outside of the preparation chamber 1 for driving the first workbench 10 to rotate.

The above-mentioned vacuum pumping system, which is connected with the preparation chamber 1, comprises a vacuum pumping device and a gas intake device, wherein the vacuum pumping device is connected to a first exhaust outlet 7 provided on the preparation chamber 1, and the gas intake device is connected to a first gas inlet 12 provided on the preparation chamber 1. The first exhaust outlet 7 and the first gas inlet 12 are positioned opposite to each other to prevent the gas from short-circuiting. The gas intake device is arranged to deliver the working gas to the interior of the preparation chamber 1.

The implantation chamber 2 is also constructed with double-layer wall, and a water inlet pipe and a water outlet pipe are arranged on the double-layer wall, wherein the implantation chamber 2 is operatively connected to the vacuum pumping system. The implantation chamber 2 is arranged for ion implantation and maintaining high vacuum condition. The ion implanter further comprises a second workbench 11 rotatably disposed in the implantation chamber 2, and a plurality of second stations 15 radially provided on the second workbench 11 at a position that the second stations 15 are arranged in a circular array. The number of the second stations 15 on the implantation chamber 2 is less than the number of the first stations 14 on the preparation chamber 1. The second workbench 11 is connected with the output end of the power switching device via the electrodes, while the input ends of the power switching device are respectively connected with the negative poles of the cleaning power supply and the implantation power supply. The wall of the implantation chamber 2 is connected to the positive poles of the cleaning power supply and the implantation power supply, wherein the baking system and the radio frequency antenna are disposed at an upper portion of the implantation chamber 2. The radio frequency antenna is connected to the radio frequency power supply outside the implantation chamber 2. A second table drive motor 111 is located outside of the implantation chamber 2 for driving the second table 11 to rotate.

The above-mentioned vacuum pumping system, which is connected with the implantation chamber 2, comprises a vacuum pumping device and a gas intake device. The vacuum pumping device is connected with a second exhaust outlet 8 provided on the implantation chamber 2, and the gas intake device is connected with the second gas inlet 13 provided on the implantation chamber 2. The second exhaust outlet 8 and the second gas inlet 13 are positioned opposite to each other to prevent the gas from short-circuiting. The gas intake device is arranged to deliver the working gas to the interior of the implantation chamber 2.

The baking system disposed in the preparation chamber 1 and the implantation chamber 2 is arranged for baking and degassing the workpiece, and combining with ion bombardment cleaning to accelerate the degassing effect on the surface of the workpiece. The radio frequency antenna is arranged to excite plasma in the vacuum chamber, widen the discharge pressure range when cleaning the workpiece, reduce the difficulty of ion bombardment cleaning and discharge, reduce the phenomenon of arc discharge, and improve the cleaning quality. An ion source is provided for ion implantation during implantation. When the cleaning power supply is connected to the workbench, a glow discharge will be generated under the appropriate pressure wherein the glow discharge will cause gas ionization to form positive ions, which can bombard the workpiece at the cathode to generate a cleaning effect. When the implantation power supply is connected to the workbench, it is arranged to accelerate the positive ions in the plasma generated by the radio frequency power supply, and the high-energy ions enter the surface of the workpiece to achieve ion implantation.

The workpiece transferring chamber 3 is constructed to have two connecting chambers perpendicular to each other, wherein the preparation chamber 1 and the implantation chamber 2 are commutatively connected to the connecting chambers of the workpiece transferring chamber 3 respectively. The workpiece transferring chamber 3 comprises a first robotic arm 4, a second robotic arm 5, and a transferring platform 16. The first and second robotic arms 4, 5 are disposed in the connecting chambers of the workpiece transferring chamber 3 respectively and are positioned perpendicular to each other. The transferring platform 16 is located at the intersection of the two connecting chambers to align with the first and second robotic arms 4, 5 for temporarily carrying the workpiece when the first and second robotic arms 4, 5 exchange the workpiece. A vacuum gate valve 6 is provided between the workpiece transferring chamber 3 and the implantation chamber 2. A rotatable partition panel 9 is provided between the workpiece transferring chamber 3 and the preparation chamber 1, wherein the rotatable partition panel 9 is arranged for thermal insulation between the workpiece transferring chamber 3 and the preparation chamber 1.

The method of ion implantation by using plasma source ion implanter with a preparation chamber for cross transferring workpiece comprises the following steps.

Step 1: Close an implantation chamber 2, close a vacuum gate valve 6, and pre-vacuum the implantation chamber 2 until a vacuum value thereof reaches at least $10^{-2}$ Pa, turn on a baking system in the implantation chamber 2 and pass hot water into a double-layer wall thereof for heating and degassing, and then vacuumize the implantation chamber 2 until a base vacuum value thereof reaches at least $10^{-4}$ Pa.

Step 2: While pre-evacuating the implantation chamber 2, open the preparation chamber 1 to place the workpiece.

Step 3: Workpiece preprocess:

Close a preparation chamber 1, pre-vacuum the preparation chamber 1 until a base vacuum value thereof reaches at least $10^{-2}$ Pa, turn on the baking system in the preparation chamber 1 and pass hot water into a double-layer wall thereof for heating and degassing, then vacuumize the preparation chamber 1 until the base vacuum value thereof is less than $5\times10^{-3}$ Pa, and feed working gas to the first gas inlet 12 through the gas intake device to a preset vacuum value. After the working gas is introduced, decrease the vacuum value, wherein the vacuum value is set to 1-100 Pa. Turn on a radio frequency power supply of the preparation chamber 1 to excite a radio frequency antenna to generate plasma, turn on a cleaning power supply corresponding to the preparation chamber 1 to form an ion bombardment cleaning. The cleaning power supply can form a negative voltage on the workpiece to accelerate the positive ions ionized in the vacuum and to bombard the surface of the workpiece with positive ions with energy, so as to remove the residual gas and pollutants adsorbed on the surface. After cleaning, stop feeding the working gas and continue to vacuum until the base vacuum value of the preparation chamber 1 is less than $5\times10^{-3}$ Pa.

Step 4: Connect the preparation chamber 1 and the implantation chamber 2:

After the preparation chamber 1 reaches the required base vacuum value, open the vacuum gate valve 6. Since the preparation chamber 1 and the implantation chamber 2 are both high vacuum condition at this time, there is no significant effect when the vacuum gate valve 6 is opened even though there is a difference in vacuum value therebetween.

Step 5: Transfer the workpiece:

Operate the first and second robotic arms 4, 5 to pick up workpiece and send the workpiece to the implantation chamber 2 through the vacuum gate valve 6, rotate the second workbench 11 in the implantation chamber 2 to place the workpiece in a proper position.

Step 6: Ion implantation:

Close the vacuum gate valve 6, continue to vacuum the implantation chamber 2 until the vacuum value in the implantation chamber 2 reaches the required base vacuum value, then introduce the working gas into the implantation chamber 2, turn on the radio frequency power supply and the implantation power supply corresponding to the implantation chamber 2 to perform ion implantation.

Step 7: Pre-cleaning a new batch of workpiece:

During the ion implantation in the implantation chamber 2, introduce the working gas into the preparation chamber 1 through the gas intake device, open the preparation chamber 1, reload a new batch of workpiece and preprocess the workpieces according to step 3.

Step 8: Ion implantation of the new batch of workpiece:

After the workpiece ion implantation in the implantation chamber 2 is completed, open the vacuum gate valve 6, operate the first and second robotic arms 4, 5 to replace the workpiece in the preparation chamber 1 and the implantation chamber 2. Since the number of stations in the preparation room 1 is more than that in the implantation room 2, the excess stations can be used as temporary stations for replacement.

Step 9: Close the vacuum gate valve 6 and perform the ion implantation in the implantation chamber 2.

Step 10: Inflate the preparation chamber 1, open the preparation chamber 1, take out the implanted workpiece, and put in a new workpiece.

The ion implanter with the dual-chamber configuration according to this embodiment has the following advantages:

1. It significantly shortens the production cycle: The main factor affecting the production cycle is pre-evacuation. The main purpose of pre-evacuation is to remove the residual gases in the vacuum chamber, wherein these gases come from the adsorption of air on the wall of the furnace when the furnace door is opened. Since oxygen molecules and water molecules in the air will release oxygen elements, the quality of the ion implantation layer will be decreased. During the plasma source ion implantation, one portion of the ions in the vacuum chamber are implanted into the surface of the workpiece while another portion of the ions will collide with the wall of the vacuum chamber to heat up the wall of the vacuum chamber, wherein the collision and heating of the ions will release residual oxygen and water molecules. Particularly, the water molecules adsorbed on the wall are difficult to be completely removed, wherein it needs to be baked for a long time at 150-250° C.

In the present invention, the implantation chamber 2 is specially provided, wherein the implantation chamber 2 is always kept in a high vacuum condition, such that the time for pre-evacuating the back vacuum can be ignored. Since the ion implantation time is usually several hours, the process time is mainly determined by the implantation time. Therefore, the present invention greatly reduces the production cycle of ion implantation, and improves the efficiency by 2-4 times compared with the existing single vacuum chamber implanter.

The preparation chamber 1 is often exposed to the atmosphere, such that oxygen and water molecules are also released. Since the entire preparation chamber 1 does not need to be degassed, only the workpiece can be degassed. Under the working vacuum of preparation chamber 1, the workpiece is subjected to higher temperature baking and ion cleaning. The content of impurity gas on the surface of the workpiece can be greatly reduced in a short time.

2. The structural configurations of the preparation chamber 1 and the implantation chamber 2 are basically the same, and can be used independently when ion implantation is required for a long time. In other words, the preparation chamber 1 and the implantation chamber 2 can serve as two independent ion implanters respectively. The two vacuum chambers can be independently degassing, the ion cleaning and cross ion implantation. via an operation of the power switching device, one of the vacuum chambers is in a cleaning state while another vacuum chamber is in the implantation state.

3. The preparation chamber 1 is designed with at least one station more than the implantation chamber 2, wherein a robotic arm can be operated to complete the batch replacement of new and old workpiece at one time.

4. Hot water is used to heat the wall while iodine tungsten lamp is used to assist baking, therefore the process of gas removal of the gas in the wall is accelerated.

5. During the ion cleaning by discharge of the radio frequency plasma, a plasma atmosphere in the vacuum chamber is formed. Using the negative potential formed on the wall of the radio frequency discharge, it can accelerate the ions to collide with the walls, accelerate the desorption of adsorbed gases, and improve the removal efficiency of impurity gas.

DETAILED DESCRIPTION OF THE PREFERRED EMBODIMENT

Figure 1:
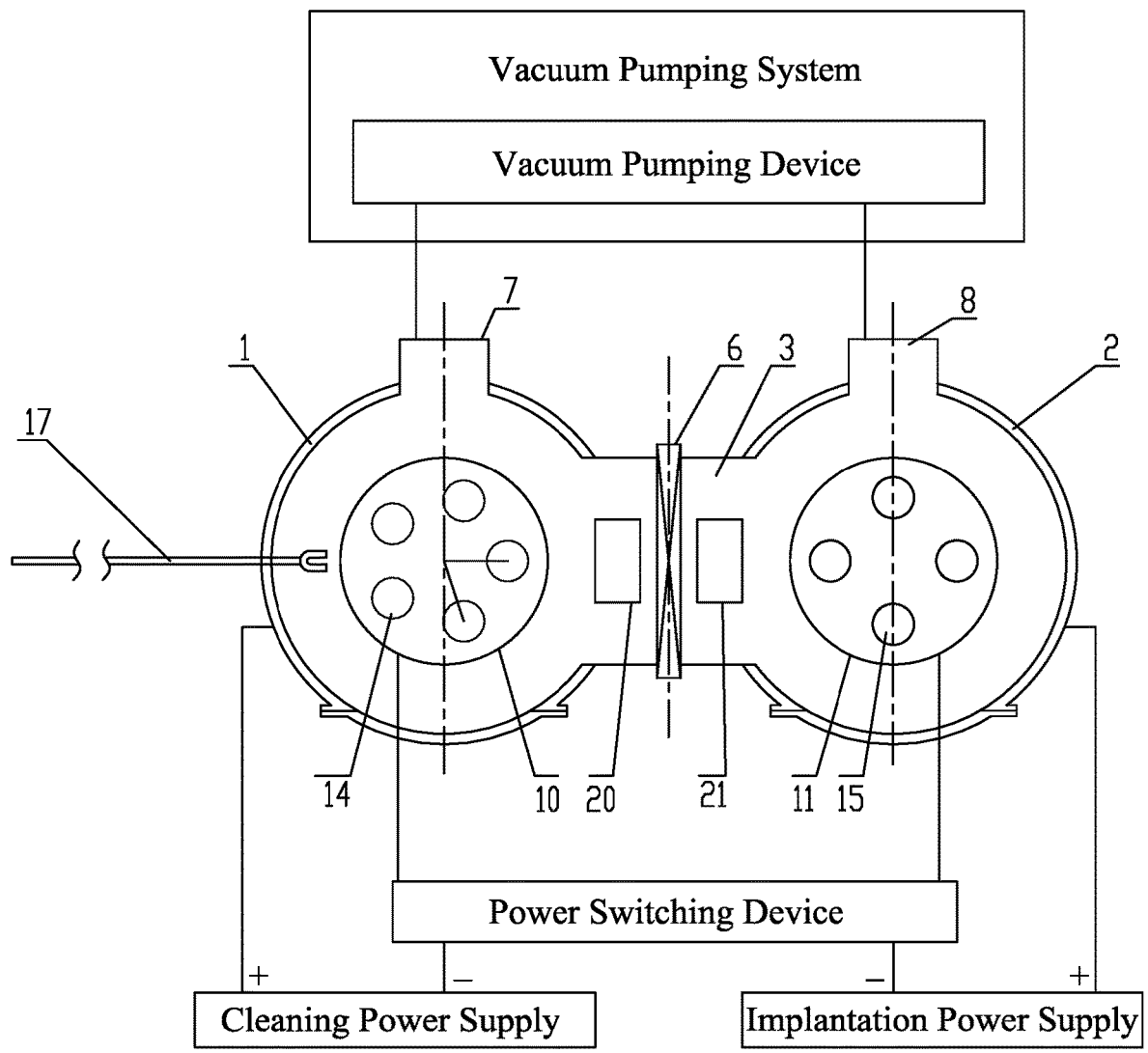
FIG. 1 is a top view of a plasma source ion implanter with a preparation chamber for linearly transferring workpiece according to a first embodiment of the present invention.

The technical solutions of the present invention should not be limited to the below specific embodiments, but also include any reasonable combination of the specific embodiments.

Embodiment 1: The present invention provides an ion implanter with a preparation chamber for linear transferring workpiece which comprises a preparation chamber 1, an implantation chamber 2 and a workpiece transferring chamber 3.

The preparation chamber 1 is constructed with a double-layer wall, and a water inlet pipe and a water outlet pipe are arranged on the double-layer wall, wherein the preparation chamber 1 is operatively connected to a vacuum pumping system. The ion implanter further comprises a first workbench 10 rotatably disposed in the preparation chamber 1, and a plurality of first stations 14 radially provided on the first workbench 10 at a position that the first stations 14 are arranged in a circular array. The ion implanter further comprises a first telescopic support member 18 having a rod shape, wherein an upper end portion of the first telescopic support rod 18 is extended to pass through a through hole formed at the first workbench 10 below the first station 14 to perpendicularly extend to the first workbench 10. A power switching device has an output end connecting to the first workbench 10 via electrodes, and input ends respectively connecting with the negative poles of the cleaning power supply and the implantation power supply. The wall of the preparation chamber 1 is connected to the positive pole of the cleaning power supply and the implantation power supply, wherein a baking system and a radio frequency antenna are disposed in the preparation chamber 1. The radio frequency antenna is connected to the radio frequency power supply outside the preparation chamber 1. A first workbench drive motor 101 is located outside of the preparation chamber 1 for driving the first workbench 10 to rotate.

The implantation chamber 2 is also constructed with double-layer wall, and a water inlet pipe and a water outlet pipe are arranged on the double-layer wall, wherein the implantation chamber 1 is operatively connected to the vacuum pumping system. The ion implanter further comprises a second workbench 11 rotatably disposed in the implantation chamber 2, and a plurality of second stations 15 radially provided on the second workbench 11 at a position that the second stations 15 are arranged in a circular array. The number of the second stations 15 on the implantation chamber 2 is less than the number of the first stations 14 on the preparation chamber 1. The ion implanter further comprises a second telescopic support member 19 having a rod shape, wherein an upper end portion of the second telescopic support rod 19 is extended to pass through a through hole formed at the second workbench 11 below the second station 15 to perpendicularly extend to the second workbench 11. The second workbench 11 is connected with the output end of the power switching device via the electrodes, while the input ends of the power switching device are respectively connected with the negative poles of the cleaning power supply and the implantation power supply. The wall of the implantation chamber 2 is connected to the positive poles of the cleaning power supply and the implantation power supply, wherein the baking system and the radio frequency antenna are disposed at an upper portion of the implantation chamber 2. The radio frequency antenna is connected to the radio frequency power supply outside the implantation chamber 2. A second table drive motor 111 is located outside of the implantation chamber 2 for driving the second table 11 to rotate.

The preparation chamber 1 and the implantation chamber 2 are connected with each other through the workpiece transferring chamber 3, wherein the preparation chamber 1 and the implantation chamber 2 are symmetrically arranged on two opposed sides of the workpiece transferring chamber 3, such that the preparation chamber 1 and the implantation chamber 2 are linearly aligned with each other. A vacuum gate valve 6 is operatively provided at a center of the workpiece transferring chamber 3. The workpiece transferring chamber 3 comprises first and second transferring platforms 20, 21 provided at a mid-portion of the workpiece transferring chamber 3, wherein the first transferring platform 20 is located at one side of the vacuum gate valve 6 while the second transferring platform 21 is located at the opposed side of the vacuum gate valve 6. In other words, the vacuum gate valve 6 is located between the first and second transferring platforms 20, 21 of the workpiece transferring chamber 3. A transferring rod 17 is provided on the left side of the preparation chamber 1, wherein the first telescopic support member 18 is provided below the first worktable 10 while the second telescopic support member 19 is provided below the second worktable 11.

This embodiment has the following beneficial effects:

The ion implanter with the dual-chamber configuration according to this embodiment has the following advantages:

1. It significantly shortens the production cycle: The main factor affecting the production cycle is pre-evacuation. The main purpose of pre-evacuation is to remove the residual gases in the vacuum chamber, wherein these gases come from the adsorption of air on the wall of the furnace when the furnace door is opened. Since oxygen molecules and water molecules in the air will release oxygen elements, the quality of the ion implantation layer will be decreased. During the plasma source ion implantation, one portion of the ions in the vacuum chamber are implanted into the surface of the workpiece while another portion of the ions will collide with the wall of the vacuum chamber to heat up the wall of the vacuum chamber, wherein the collision and heating of the ions will release residual oxygen and water molecules. Particularly, the water molecules adsorbed on the wall are difficult to be completely removed, wherein it needs to be baked for a long time at 150-250° C.

In this embodiment, the implantation chamber 2 is specially provided, wherein the implantation chamber 2 is always kept in a high vacuum condition, such that the time for pre-evacuating the back vacuum can be ignored. Since the ion implantation time is usually several hours, the process time is mainly determined by the implantation time. Therefore, the present invention greatly reduces the production cycle of ion implantation, and improves the efficiency by 2-4 times compared with the existing single vacuum chamber implanter.

The preparation chamber 1 is often exposed to the atmosphere, such that oxygen and water molecules are also released. Since the entire preparation chamber 1 does not need to be degassed, only the workpiece can be degassed. Under the working vacuum of preparation chamber 1, the workpiece is subjected to higher temperature baking and ion cleaning. The content of impurity gas on the surface of the workpiece can be greatly reduced in a short time.

2. The structural configurations of the preparation chamber 1 and the implantation chamber 2 are basically the same, and can be used independently when ion implantation is required for a long time. In other words, the preparation chamber 1 and the implantation chamber 2 can serve as two independent ion implanters respectively. The two vacuum chambers can be independently degassing, the ion cleaning and cross ion implantation. via an operation of the power switching device, one of the vacuum chambers is in a cleaning state while another vacuum chamber is in the implantation state.

3. The preparation chamber 1 is designed with at least one station more than the implantation chamber 2, wherein a robotic arm can be operated to complete the batch replacement of new and old workpiece at one time.

4. Hot water is used to heat the wall while iodine tungsten lamp is used to assist baking, therefore the process of gas removal of the gas in the wall is accelerated.

5. During the ion cleaning by discharge of the radio frequency plasma, a plasma atmosphere in the vacuum chamber is formed. Using the negative potential formed on the wall of the radio frequency discharge, it can accelerate the ions to collide with the walls, accelerate the desorption of adsorbed gases, and improve the removal efficiency of impurity gas.

Embodiment 2: The difference between this embodiment and Embodiment 1 is that: The above-mentioned vacuum pumping system, which is connected with the preparation chamber 1, comprises a vacuum pumping device and a gas intake device, wherein the vacuum pumping device is connected to a first exhaust outlet 7 provided on the preparation chamber 1, and the gas intake device is connected to a first gas inlet 12 provided on the preparation chamber 1. The first exhaust outlet 7 and the first gas inlet 12 are positioned opposite to each other to prevent the gas from short-circuiting. The gas intake device is arranged to deliver the working gas to the interior of the preparation chamber 1. The above-mentioned vacuum pumping system, which is connected with the implantation chamber 2, comprises a vacuum pumping device and a gas intake device. The vacuum pumping device is connected with a second exhaust outlet 8 provided on the implantation chamber 2, and the gas inlet device is connected with the second gas inlet 13 provided on the implantation chamber 2. The second exhaust outlet 8 and the second gas inlet 13 are positioned opposite to each other.

Embodiment 3: The difference between this embodiment and Embodiment 1 or 2 is the baking system is embodied as a baking lamp.

Embodiment 4: The difference between this embodiment and Embodiments 1 to 3 is that: the power switching device is a double throw knife switch, wherein the output voltage of the cleaning power supply is 0-2 kV and the output voltage of the implantation power supply is 1-60 kV.

Embodiment 5: The method of ion implantation by using plasma source ion implanter with a preparation chamber for linear transferring workpiece comprises the following steps.

Step 1: Close an implantation chamber 2, close a vacuum gate valve 6, and pre-vacuum the implantation chamber 2 until a vacuum value thereof reaches at least $10^{-2}$ Pa, turn on a baking system in the implantation chamber 2 and pass hot water into a double-layer wall thereof for heating and degassing, and then vacuumize the implantation chamber 2 until a base vacuum value thereof reaches at least $10^{-4}$ Pa.

Step 2: While pre-evacuating the implantation chamber 2, open the preparation chamber 1 to place the workpiece.

Step 3: Workpiece preprocess:

Close a preparation chamber 1, pre-vacuum the preparation chamber 1 until a base vacuum value thereof reaches at least $10^{-2}$ Pa, turn on the baking system in the preparation chamber 1 and pass hot water into a double-layer wall thereof for heating and degassing, then vacuumize the preparation chamber 1 until the base vacuum value thereof is less than $5 \times 10^{-3}$ Pa, and feed working gas to the first gas inlet 12 through the gas intake device to a preset vacuum value, turn on a radio frequency power supply of the preparation chamber 1 to excite a radio frequency antenna to generate plasma, turn on a cleaning power supply corresponding to the preparation chamber 1 to form an ion bombardment cleaning, then, after cleaning, stop feeding the working gas and continue to vacuum until the base vacuum value of the preparation chamber 1 is less than $5 \times 10^{-3}$ Pa.

Step 4: Connect the preparation chamber 1 and the implantation chamber 2:

After the preparation chamber 1 reaches the required base vacuum value, open the vacuum gate valve 6.

Step 5: Transfer the workpiece:

When transferring the workpiece, operate the first telescopic support member 18 or the second telescopic support member 19 to lift the workpiece on the first station 14 or the second station 15, then operate the transferring rod 17 to linearly move to extend a front end thereof under the workpiece, lower the first telescopic support member 18 or the second telescopic support member 19, completes picking up the workpiece, and transfer the workpiece between the first station 14 and the second station 15.

Step 6: Ion implantation:

Close the vacuum gate valve 6, continue to vacuum the implantation chamber 2 until the vacuum value in the implantation chamber 2 reaches the required base vacuum value, then introduce the working gas into the implantation chamber 2, turn on the radio frequency power supply and the implantation power supply corresponding to the implantation chamber 2 to perform ion implantation.

Step 7: Pre-cleaning a new batch of workpiece:

During the ion implantation in the implantation chamber 2, introduce the working gas into the preparation chamber 1 through the gas intake device, open the preparation chamber 1, reload a new batch of workpiece and preprocess the workpieces according to step 3.

Step 8: Ion implantation of the new batch of workpiece:

After the workpiece ion implantation in the implantation chamber 2 is completed, open the vacuum gate valve 6, operate the transferring rod 17 to linearly move to replace the workpiece in the preparation chamber 1 and the implantation chamber 2.

Step 9: Close the vacuum gate valve 6 and perform the ion implantation in the implantation chamber 2.

Step 10: Inflate the preparation chamber 1, open the preparation chamber 1, take out the implanted workpiece, and put in a new workpiece.

The ion implanter with the dual-chamber configuration according to this embodiment has the following advantages:

1. It significantly shortens the production cycle: The main factor affecting the production cycle is pre-evacuation. The main purpose of pre-evacuation is to remove the residual gases in the vacuum chamber, wherein these gases come from the adsorption of air on the wall of the furnace when the furnace door is opened. Since oxygen molecules and water molecules in the air will release oxygen elements, the quality of the ion implantation layer will be decreased. During the plasma source ion implantation, one portion of the ions in the vacuum chamber are implanted into the surface of the workpiece while another portion of the ions will collide with the wall of the vacuum chamber to heat up the wall of the vacuum chamber, wherein the collision and heating of the ions will release residual oxygen and water molecules. Particularly, the water molecules adsorbed on the wall are difficult to be completely removed, wherein it needs to be baked for a long time at 150-250° C.

In this embodiment, the implantation chamber 2 is specially provided, wherein the implantation chamber 2 is always kept in a high vacuum condition, such that the time for pre-evacuating the back vacuum can be ignored. Since the ion implantation time is usually several hours, the process time is mainly determined by the implantation time. Therefore, the present invention greatly reduces the production cycle of ion implantation, and improves the efficiency by 2-4 times compared with the existing single vacuum chamber implanter.

The preparation chamber 1 is often exposed to the atmosphere, such that oxygen and water molecules are also released. Since the entire preparation chamber 1 does not need to be degassed, only the workpiece can be degassed. Under the working vacuum of preparation chamber 1, the workpiece is subjected to higher temperature baking and ion cleaning. The content of impurity gas on the surface of the workpiece can be greatly reduced in a short time.

2. The structural configurations of the preparation chamber 1 and the implantation chamber 2 are basically the same, and can be used independently when ion implantation is required for a long time. In other words, the preparation chamber 1 and the implantation chamber 2 can serve as two independent ion implanters respectively. The two vacuum chambers can be independently degassing, the ion cleaning and cross ion implantation. via an operation of the power switching device, one of the vacuum chambers is in a cleaning state while another vacuum chamber is in the implantation state.

3. The preparation chamber 1 is designed with at least one station more than the implantation chamber 2, wherein a robotic arm can be operated to complete the batch replacement of new and old workpiece at one time.

4. Hot water is used to heat the wall while iodine tungsten lamp is used to assist baking, therefore the process of gas removal of the gas in the wall is accelerated.

5. During the ion cleaning by discharge of the radio frequency plasma, a plasma atmosphere in the vacuum chamber is formed. Using the negative potential formed on the wall of the radio frequency discharge, it can accelerate the ions to collide with the walls, accelerate the desorption of adsorbed gases, and improve the removal efficiency of impurity gas.

Embodiment 6: The plasma source ion implanter with a preparation chamber for cross transferring workpiece according to this embodiment comprises a preparation chamber 1, an implantation chamber 2 and a workpiece transferring chamber 3.

The preparation chamber 1 is constructed with a double-layer wall, and a water inlet pipe and a water outlet pipe are arranged on the double-layer wall, wherein the preparation chamber 1 is operatively connected to a vacuum pumping system. The ion implanter further comprises a first workbench 10 rotatably disposed in the preparation chamber 1, and a plurality of first stations 14 radially provided on the first workbench 10 at a position that the first stations 14 are arranged in a circular array. A power switching device has an output end connecting to the first workbench 10 via electrodes, and input ends respectively connecting with the negative poles of the cleaning power supply and the implantation power supply. The wall of the preparation chamber 1 is connected to the positive pole of the cleaning power supply and the implantation power supply, wherein a baking system and a radio frequency antenna are disposed in the preparation chamber 1. The radio frequency antenna is connected to the radio frequency power supply outside the preparation chamber 1. A first workbench drive motor 101 is located outside of the preparation chamber 1 for driving the first workbench 10 to rotate.

The implantation chamber 2 is also constructed with double-layer wall, and a water inlet pipe and a water outlet pipe are arranged on the double-layer wall, wherein the implantation chamber 2 is operatively connected to the vacuum pumping system. The ion implanter further comprises a second workbench 11 rotatably disposed in the implantation chamber 2, and a plurality of second stations 15 radially provided on the second workbench 11 at a position that the second stations 15 are arranged in a circular array. The number of the second stations 15 on the implantation chamber 2 is less than the number of the first stations 14 on the preparation chamber 1. The second workbench 11 is connected with the output end of the power switching device via the electrodes, while the input ends of the power switching device are respectively connected with the negative poles of the cleaning power supply and the implantation power supply. The wall of the implantation chamber 2 is connected to the positive poles of the cleaning power supply and the implantation power supply, wherein the baking system and the radio frequency antenna are disposed at an upper portion of the implantation chamber 2. The radio frequency antenna is connected to the radio frequency power supply outside the implantation chamber 2. A second table drive motor 111 is located outside of the implantation chamber 2 for driving the second table 11 to rotate.

The workpiece transferring chamber 3 is constructed to have two connecting chambers perpendicular to each other, wherein the preparation chamber 1 and the implantation chamber 2 are commutatively connected to the connecting chambers of the workpiece transferring chamber 3 respectively. The workpiece transferring chamber 3 comprises a first robotic arm 4, a second robotic arm 5, and a transferring platform 16. The first and second robotic arms 4, 5 are disposed in the connecting chambers of the workpiece transferring chamber 3 respectively and are positioned perpendicular to each other. The transferring platform 16 is located at the intersection of the two connecting chambers to align with the first and second robotic arms 4, 5 for temporarily carrying the workpiece when the first and second robotic arms 4, 5 exchange the workpiece. A vacuum gate valve 6 is provided between the workpiece transferring chamber 3 and the implantation chamber 2. A rotatable partition panel 9 is provided between the workpiece transferring chamber 3 and the preparation chamber 1.

The ion implanter with the dual-chamber configuration according to this embodiment has the following advantages:

1. It significantly shortens the production cycle: The main factor affecting the production cycle is pre-evacuation. The main purpose of pre-evacuation is to remove the residual gases in the vacuum chamber, wherein these gases come from the adsorption of air on the wall of the furnace when the furnace door is opened. Since oxygen molecules and water molecules in the air will release oxygen elements, the quality of the ion implantation layer will be decreased. During the plasma source ion implantation, one portion of the ions in the vacuum chamber are implanted into the surface of the workpiece while another portion of the ions will collide with the wall of the vacuum chamber to heat up the wall of the vacuum chamber, wherein the collision and heating of the ions will release residual oxygen and water molecules. Particularly, the water molecules adsorbed on the wall are difficult to be completely removed, wherein it needs to be baked for a long time at 150-250° C.

In this embodiment, the implantation chamber 2 is specially provided, wherein the implantation chamber 2 is always kept in a high vacuum condition, such that the time for pre-evacuating the back vacuum can be ignored. Since the ion implantation time is usually several hours, the process time is mainly determined by the implantation time. Therefore, the present invention greatly reduces the production cycle of ion implantation, and improves the efficiency by 2-4 times compared with the existing single vacuum chamber implanter.

The preparation chamber 1 is often exposed to the atmosphere, such that oxygen and water molecules are also released. Since the entire preparation chamber 1 does not need to be degassed, only the workpiece can be degassed. Under the working vacuum of preparation chamber 1, the workpiece is subjected to higher temperature baking and ion cleaning. The content of impurity gas on the surface of the workpiece can be greatly reduced in a short time.

2. The structural configurations of the preparation chamber 1 and the implantation chamber 2 are basically the same, and can be used independently when ion implantation is required for a long time. In other words, the preparation chamber 1 and the implantation chamber 2 can serve as two independent ion implanters respectively. The two vacuum chambers can be independently degassing, the ion cleaning and cross ion implantation. via an operation of the power switching device, one of the vacuum chambers is in a cleaning state while another vacuum chamber is in the implantation state.

3. The preparation chamber 1 is designed with at least one station more than the implantation chamber 2, wherein a robotic arm can be operated to complete the batch replacement of new and old workpiece at one time.

4. Hot water is used to heat the wall while iodine tungsten lamp is used to assist baking, therefore the process of gas removal of the gas inside the wall is accelerated.

5. During the ion cleaning by discharge of the radio frequency plasma, a plasma atmosphere in the vacuum chamber is formed. Using the negative potential formed on the wall of the radio frequency discharge, it can accelerate the ions to collide with the walls, accelerate the desorption of adsorbed gases, and improve the removal efficiency of impurity gas.

Embodiment 7: The difference between this embodiment and Embodiments 1 to 6 is that: The above-mentioned vacuum pumping system, which is connected with the preparation chamber 1, comprises a vacuum pumping device and a gas intake device, wherein the vacuum pumping device is connected to a first exhaust outlet 7 provided on the preparation chamber 1, and the gas intake device is connected to a first gas inlet 12 provided on the preparation chamber 1. The first exhaust outlet 7 and the first gas inlet 12 are positioned opposite to each other to prevent the gas from short-circuiting. The gas intake device is arranged to deliver the working gas to the interior of the preparation chamber 1. The above-mentioned vacuum pumping system, which is connected with the implantation chamber 2, comprises a vacuum pumping device and a gas intake device. The vacuum pumping device is connected with a second exhaust outlet 8 provided on the implantation chamber 2, and the gas intake device is connected with the second gas inlet 13 provided on the implantation chamber 2. The second exhaust outlet 8 and the second gas intake 13 are positioned opposite to each other.

Embodiment 8: The difference between this embodiment and Embodiment 1 to 7 is the baking system is a baking lamp.

Embodiment 9: The difference between this embodiment and Embodiments 1 to 8 is that: the power switching device is a double throw knife switch, wherein the output voltage of the cleaning power supply is 0-2 kV and the output voltage of the implantation power supply is 1-60 kV.

Embodiment 10: The method of ion implantation by using plasma source ion implanter with a preparation chamber for cross transferring workpiece comprises the following steps.

Step 1: Close an implantation chamber 2, close a vacuum gate valve 6, and pre-vacuum the implantation chamber 2 until a vacuum value thereof reaches at least $10^{-2}$ Pa, turn on a baking system in the implantation chamber 2 and pass hot water into a double-layer wall thereof for heating and degassing, and then vacuumize the implantation chamber 2 until a base vacuum value thereof reaches at least $10^{-4}$ Pa.

Step 2: While pre-evacuating the implantation chamber 2, open the preparation chamber 1 to place the workpiece.

Step 3: Workpiece preprocess:

Close a preparation chamber 1, pre-vacuum the preparation chamber 1 until a base vacuum value thereof reaches at least $10^{-2}$ Pa, turn on the baking system in the preparation chamber 1 and pass hot water into a double-layer wall thereof for heating and degassing, then vacuumize the preparation chamber 1 until the base vacuum value thereof is less than $5 \times 10^{-3}$ Pa, and feed working gas to the first gas inlet 12 through the gas intake device to a preset vacuum value, turn on a radio frequency power supply of the preparation chamber 1 to excite a radio frequency antenna to generate plasma, turn on a cleaning power supply corresponding to the preparation chamber 1 to form an ion bombardment cleaning, then, after cleaning, stop feeding the working gas and continue to vacuum until the base vacuum value of the preparation chamber 1 is less than $5 \times 10^{-3}$ Pa.

Step 4: Connect the preparation chamber 1 and the implantation chamber 2:

After the preparation chamber 1 reaches the required base vacuum value, open the vacuum gate valve 6.

Step 5: Transfer the workpiece:

Operate the first and second robotic arms 4, 5 to pick up workpiece and send the workpiece to the implantation chamber 2 through the vacuum gate valve 6, rotate the second workbench 11 in the implantation chamber 2 to place the workpiece in a proper position.

Step 6: Ion implantation:

Close the vacuum gate valve 6, continue to vacuum the implantation chamber 2 until the vacuum value in the implantation chamber 2 reaches the required base vacuum value, then introduce the working gas into the implantation chamber 2, turn on the radio frequency power supply and the implantation power supply corresponding to the implantation chamber 2 to perform ion implantation.

Step 7: Pre-cleaning a new batch of workpiece:

During the ion implantation in the implantation chamber 2, introduce the working gas into the preparation chamber 1 through the gas intake device, open the preparation chamber 1, reload a new batch of workpiece and preprocess the workpieces according to step 3.

Step 8: Ion implantation of the new batch of workpiece:

After the workpiece ion implantation in the implantation chamber 2 is completed, open the vacuum gate valve 6, operate the first and second robotic arms 4, 5 to replace the workpiece in the preparation chamber 1 and the implantation chamber 2.

Step 9: Close the vacuum gate valve 6 and perform the ion implantation in the implantation chamber 2.

Step 10: Inflate the preparation chamber 1, open the preparation chamber 1, take out the implanted workpiece, and put in a new workpiece.

The ion implanter with the dual-chamber configuration according to this embodiment has the following advantages:

1. It significantly shortens the production cycle: The main factor affecting the production cycle is pre-evacuation. The main purpose of pre-evacuation is to remove the residual gases in the vacuum chamber, wherein these gases come from the adsorption of air on the wall of the furnace when the furnace door is opened. Since oxygen molecules and water molecules in the air will release oxygen elements, the quality of the ion implantation layer will be decreased. During the plasma source ion implantation, one portion of the ions in the vacuum chamber are implanted into the surface of the workpiece while another portion of the ions will collide with the wall of the vacuum chamber to heat up the wall of the vacuum chamber, wherein the collision and heating of the ions will release residual oxygen and water molecules. Particularly, the water molecules adsorbed on the wall are difficult to be completely removed, wherein it needs to be baked for a long time at 150-250° C.

In this embodiment, the implantation chamber 2 is specially provided, wherein the implantation chamber 2 is always kept in a high vacuum condition, such that the time for pre-evacuating the back vacuum can be ignored. Since the ion implantation time is usually several hours, the process time is mainly determined by the implantation time. Therefore, the present invention greatly reduces the production cycle of ion implantation, and improves the efficiency by 2-4 times compared with the existing single vacuum chamber implanter.

The preparation chamber 1 is often exposed to the atmosphere, such that oxygen and water molecules are also released. Since the entire preparation chamber 1 does not need to be degassed, only the workpiece can be degassed. Under the working vacuum of preparation chamber 1, the workpiece is subjected to higher temperature baking and ion cleaning. The content of impurity gas on the surface of the workpiece can be greatly reduced in a short time.

2. The structural configurations of the preparation chamber 1 and the implantation chamber 2 are basically the same, and can be used independently when ion implantation is required for a long time. In other words, the preparation chamber 1 and the implantation chamber 2 can serve as two independent ion implanters respectively. The two vacuum chambers can be independently degassing, the ion cleaning and cross ion implantation. via an operation of the power switching device, one of the vacuum chambers is in a cleaning state while another vacuum chamber is in the implantation state.

3. The preparation chamber 1 is designed with at least one station more than the implantation chamber 2, wherein a robotic arm can be operated to complete the batch replacement of new and old workpiece at one time.

4. Hot water is used to heat the wall while iodine tungsten lamp is used to assist baking, therefore the process of gas removal of the gas inside the wall is accelerated.

5. During the ion cleaning by discharge of the radio frequency plasma, a plasma atmosphere in the vacuum chamber is formed. Using the negative potential formed on the wall of the radio frequency discharge, it can accelerate the ions to collide with the walls, accelerate the desorption of adsorbed gases, and improve the removal efficiency of impurity gas.

Example 1

Figure 2:
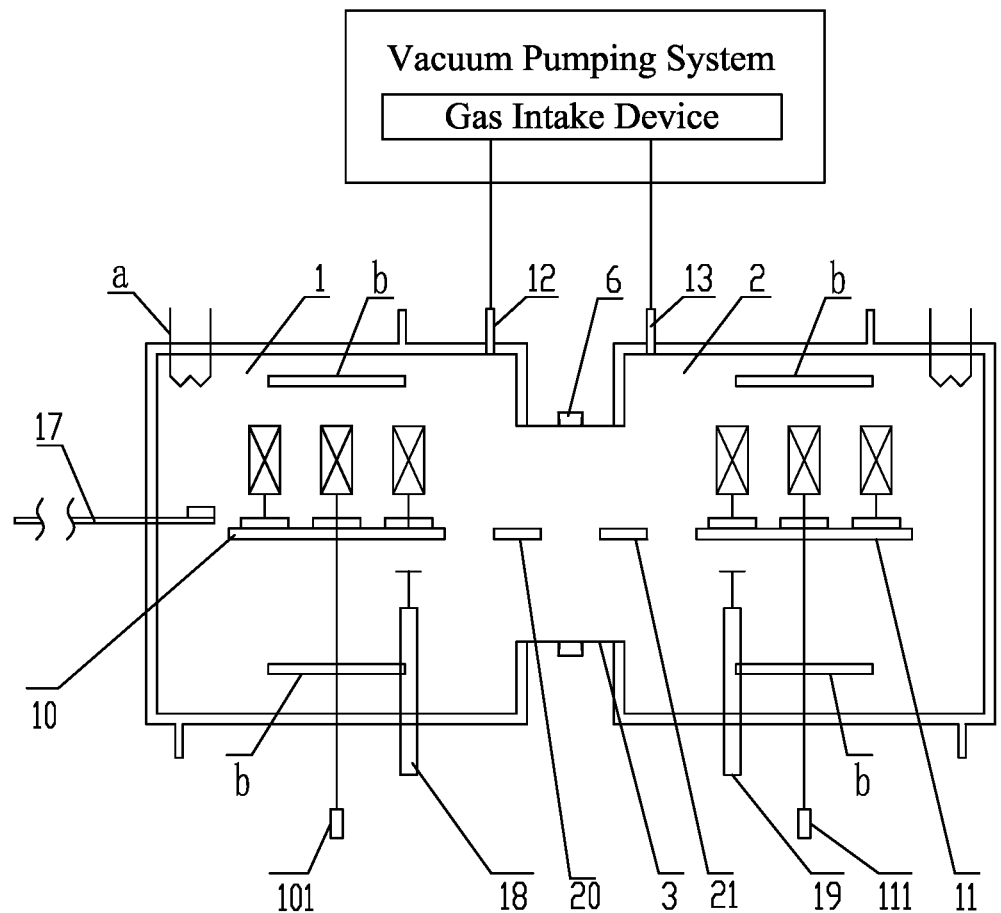
FIG. 2 is a sectional view of the plasma source ion implanter with the preparation chamber for linearly transferring workpiece according to the first embodiment of the present invention, wherein a represents a radio frequency antenna and b represents a baking lamp.

Referring to FIGS. 1 and 2 of the drawings, an ion implanter with a preparation chamber for linear transferring workpiece according to the first embodiment comprises a preparation chamber 1, an implantation chamber 2 and a workpiece transferring chamber 3.

The preparation chamber 1 is constructed with a double-layer wall, and a water inlet pipe and a water outlet pipe are arranged on the double-layer wall, wherein the preparation chamber 1 is operatively connected to a vacuum pumping system. The preparation chamber 1 is arranged for pre-vacuuming, degassing and surface ion cleaning of the workpiece. The ion implanter further comprises a first workbench 10 rotatably disposed in the preparation chamber 1, and a plurality of first stations 14 radially provided on the first workbench 10 at a position that the first stations 14 are arranged in a circular array. The ion implanter further comprises a first telescopic support member 18 having a rod shape, wherein an upper end portion of the first telescopic support rod 18 is extended to pass through a through hole formed at the first workbench 10 below the first station 14 to perpendicularly extend to the first workbench 10. A power switching device has an output end connecting to the first workbench 10 via electrodes, and input ends respectively connecting with the negative poles of the cleaning power supply and the implantation power supply. The wall of the preparation chamber 1 is connected to the positive pole of the cleaning power supply and the implantation power supply, wherein a baking system and a radio frequency antenna are disposed in the preparation chamber 1. The radio frequency antenna is connected to the radio frequency power supply outside the preparation chamber 1. A first workbench drive motor 101 is located outside of the preparation chamber 1 for driving the first workbench 10 to rotate.

The above-mentioned vacuum pumping system, which is connected with the preparation chamber 1, comprises a vacuum pumping device and a gas intake device, wherein the vacuum pumping device is connected to a first exhaust outlet 7 provided on the preparation chamber 1, and the gas intake device is connected to a first gas inlet 12 provided on the preparation chamber 1. The first exhaust outlet 7 and the first gas inlet 12 are positioned opposite to each other to prevent the gas from short-circuiting. The gas intake device is arranged to deliver the working gas to the interior of the preparation chamber 1.

The implantation chamber 2 is also constructed with double-layer wall, and a water inlet pipe and a water outlet pipe are arranged on the double-layer wall, wherein the implantation chamber 1 is operatively connected to the vacuum pumping system. The implantation chamber 2 is arranged to perform ion implantation and maintain a high vacuum condition. The ion implanter further comprises a second workbench 11 rotatably disposed in the implantation chamber 2, and a plurality of second stations 15 radially provided on the second workbench 11 at a position that the second stations 15 are arranged in a circular array. The number of the second stations 15 on the implantation chamber 2 is less than the number of the first stations 14 on the preparation chamber 1. The ion implanter further comprises a second telescopic support member 19 having a rod shape, wherein an upper end portion of the second telescopic support rod 19 is extended to pass through a through hole formed at the second workbench 11 below the second station 15 to perpendicularly extend to the second workbench 11. The second workbench 11 is connected with the output end of the power switching device via the electrodes, while the input ends of the power switching device are respectively connected with the negative poles of the cleaning power supply and the implantation power supply. The wall of the implantation chamber 2 is connected to the positive poles of the cleaning power supply and the implantation power supply, wherein the baking system and the radio frequency antenna are disposed at an upper portion of the implantation chamber 2. The radio frequency antenna is connected to the radio frequency power supply outside the implantation chamber 2. A second table drive motor 111 is located outside of the implantation chamber 2 for driving the second table 11 to rotate.

The above-mentioned vacuum pumping system, which is connected with the implantation chamber 2, comprises a vacuum pumping device and a gas intake device. The vacuum pumping device is connected with a second exhaust outlet 8 provided on the implantation chamber 2, and the gas intake device is connected with the second gas inlet 13 provided on the implantation chamber 2. The second exhaust outlet 8 and the second gas inlet 13 are positioned opposite to each other to prevent the gas from short-circuiting. The gas intake device is arranged to deliver the working gas to the interior of the implantation chamber 2.

The baking system disposed in the preparation chamber 1 and the implantation chamber 2 is arranged for baking and degassing the workpiece, and combining with ion bombardment cleaning to accelerate the degassing effect on the surface of the workpiece. The radio frequency antenna is arranged to excite plasma in the vacuum chamber, widen the discharge pressure range when cleaning the workpiece, reduce the difficulty of ion bombardment cleaning and discharge, reduce the phenomenon of arc discharge, and improve the cleaning quality. An ion source is provided for ion implantation during implantation. When the cleaning power supply is connected to the workbench, a glow discharge will be generated under the appropriate pressure wherein the glow discharge will cause gas ionization to form positive ions, which can bombard the workpiece at the cathode to generate a cleaning effect. When the implantation power supply is connected to the workbench, it is arranged to accelerate the positive ions in the plasma generated by the radio frequency power supply, and the high-energy ions enter the surface of the workpiece to achieve ion implantation.

The preparation chamber 1 and the implantation chamber 2 are connected with each other through the workpiece transferring chamber 3, wherein the preparation chamber 1 and the implantation chamber 2 are symmetrically arranged on two opposed sides of the workpiece transferring chamber 3, such that the preparation chamber 1 and the implantation chamber 2 are linearly aligned with each other. A vacuum gate valve 6 is operatively provided at a center of the workpiece transferring chamber 3. The workpiece transferring chamber 3 comprises first and second transferring platforms 20, 21 provided at a mid-portion of the workpiece transferring chamber 3, wherein the first transferring platform 20 is located at one side of the vacuum gate valve 6 while the second transferring platform 21 is located at the opposed side of the vacuum gate valve 6. In other words, the vacuum gate valve 6 is located between the first and second transferring platforms 20, 21 of the workpiece transferring chamber 3. A transferring rod 17 is provided on the left side of the preparation chamber 1, wherein the first telescopic support member 18 is provided below the first worktable 10 while the second telescopic support member 19 is provided below the second worktable 11.

The baking system is embodied as a baking lamp. The power switching device is a double throw knife switch. The cleaning power supply and the implantation power supply are spaced apart from each other to create enough space therebetween to prevent any breakdown. The output voltage of the cleaning power supply is 0-2 kV and the output voltage of the implantation power supply is 1-60 kV.

The method of ion implantation by using plasma source ion implanter with a preparation chamber for linear transferring workpiece comprises the following steps.

Step 1: Close an implantation chamber 2, close a vacuum gate valve 6, and pre-vacuum the implantation chamber 2 until a vacuum value thereof reaches at least $10^{-2}$ Pa, turn on a baking system in the implantation chamber 2 and pass hot water into a double-layer wall thereof for heating and degassing, and then vacuumize the implantation chamber 2 until a base vacuum value thereof reaches at least $10^{-4}$ Pa.

Step 2: While pre-evacuating the implantation chamber 2, open the preparation chamber 1 to place the workpiece.

Step 3: Workpiece preprocess:

Close a preparation chamber 1, pre-vacuum the preparation chamber 1 until a base vacuum value thereof reaches at least $10^{-2}$ Pa, turn on the baking system in the preparation chamber 1 and pass hot water into a double-layer wall thereof for heating and degassing, then vacuumize the preparation chamber 1 until the base vacuum value thereof is less than $5 \times 10^{-3}$ Pa, and feed working gas to the first gas inlet 12 through the gas intake device to a preset vacuum value. After the working gas is introduced, decrease the vacuum value, wherein the vacuum value is set at 1-100 Pa. Turn on a radio frequency power supply of the preparation chamber 1 to excite a radio frequency antenna to generate plasma, and turn on a cleaning power supply corresponding to the preparation chamber 1 to form an ion bombardment cleaning. The cleaning power supply can form a negative voltage on the workpiece to accelerate the positive ions ionized in the vacuum and bombard the surface of the workpiece with positive ions with energy, so as to remove the residual gas and pollutants adsorbed on the surface. Then, after cleaning, stop feeding the working gas and continue to vacuum until the base vacuum value of the preparation chamber 1 is less than $5 \times 10^{-3}$ Pa.

Step 4: Connect the preparation chamber 1 and the implantation chamber 2:

After the preparation chamber 1 reaches the required base vacuum value, open the vacuum gate valve 6. Since the preparation chamber 1 and the implantation chamber 2 are both high vacuum condition at this time, there is no significant effect when the vacuum gate valve 6 is opened even though there is a difference in vacuum value therebetween.

Step 5: Transfer the workpiece:

When transferring the workpiece, operate the first telescopic support member 18 or the second telescopic support member 19 to lift the workpiece on the first station 14 or the second station 15, then operate the transferring rod 17 to linearly move to extend a front end thereof under the workpiece, lower the first telescopic support member 18 or the second telescopic support member 19, completes picking up the workpiece, and transfer the workpiece between the first station 14 and the second station 15. The first and second transferring platforms 20, 21 are arranged to temporarily support the transferring rod 17.

Step 6: Ion implantation:

Close the vacuum gate valve 6, continue to vacuum the implantation chamber 2 until the vacuum value in the implantation chamber 2 reaches the required base vacuum value, then introduce the working gas into the implantation chamber 2, turn on the radio frequency power supply and the implantation power supply corresponding to the implantation chamber 2 to perform ion implantation.

Step 7: Pre-cleaning a new batch of workpiece:

During the ion implantation in the implantation chamber 2, introduce the working gas into the preparation chamber 1 through the gas intake device, open the preparation chamber 1, reload a new batch of workpiece and preprocess the workpieces according to step 3.

Step 8: Ion implantation of the new batch of workpiece:

After the workpiece ion implantation in the implantation chamber 2 is completed, open the vacuum gate valve 6, operate the transferring rod 17 to linearly move to replace the workpiece in the preparation chamber 1 and the implantation chamber 2. Since the number of stations in the preparation room 1 is more than that in the implantation room 2, the excess stations can be used as temporary stations for replacement.

Step 9: Close the vacuum gate valve 6 and perform the ion implantation in the implantation chamber 2.

Step 10: Inflate the preparation chamber 1, open the preparation chamber 1, take out the implanted workpiece, and put in a new workpiece.

The ion implanter with the dual-chamber configuration according to this embodiment has the following advantages:

1. It significantly shortens the production cycle: The main factor affecting the production cycle is pre-evacuation. The main purpose of pre-evacuation is to remove the residual gases in the vacuum chamber, wherein these gases come from the adsorption of air on the wall of the furnace when the furnace door is opened. Since oxygen molecules and water molecules in the air will release oxygen elements, the quality of the ion implantation layer will be decreased. During the plasma source ion implantation, one portion of the ions in the vacuum chamber are implanted into the surface of the workpiece while another portion of the ions will collide with the wall of the vacuum chamber to heat up the wall of the vacuum chamber, wherein the collision and heating of the ions will release residual oxygen and water molecules. Particularly, the water molecules adsorbed on the wall are difficult to be completely removed, wherein it needs to be baked for a long time at 150-250° C.

In this embodiment, the implantation chamber 2 is specially provided, wherein the implantation chamber 2 is always kept in a high vacuum condition, such that the time for pre-evacuating the back vacuum can be ignored. Since the ion implantation time is usually several hours, the process time is mainly determined by the implantation time. Therefore, the present invention greatly reduces the production cycle of ion implantation, and improves the efficiency by 2-4 times compared with the existing single vacuum chamber implanter.

The preparation chamber 1 is often exposed to the atmosphere, such that oxygen and water molecules are also released. Since the entire preparation chamber 1 does not need to be degassed, only the workpiece can be degassed. Under the working vacuum of preparation chamber 1, the workpiece is subjected to higher temperature baking and ion cleaning. The content of impurity gas on the surface of the workpiece can be greatly reduced in a short time.

2. The structural configurations of the preparation chamber 1 and the implantation chamber 2 are basically the same, and can be used independently when ion implantation is required for a long time. In other words, the preparation chamber 1 and the implantation chamber 2 can serve as two independent ion implanters respectively. The two vacuum chambers can be independently degassing, the ion cleaning and cross ion implantation. via an operation of the power switching device, one of the vacuum chambers is in a cleaning state while another vacuum chamber is in the implantation state.

3. The preparation chamber 1 is designed with at least one station more than the implantation chamber 2, wherein a robotic arm can be operated to complete the batch replacement of new and old workpiece at one time.

4. Hot water is used to heat the wall while iodine tungsten lamp is used to assist baking, therefore the process of gas removal of the gas inside the wall is accelerated.

5. During the ion cleaning by discharge of the radio frequency plasma, a plasma atmosphere in the vacuum chamber is formed. Using the negative potential formed on the wall of the radio frequency discharge, it can accelerate the ions to collide with the walls, accelerate the desorption of adsorbed gases, and improve the removal efficiency of impurity gas.

Example 2

Figure 3:
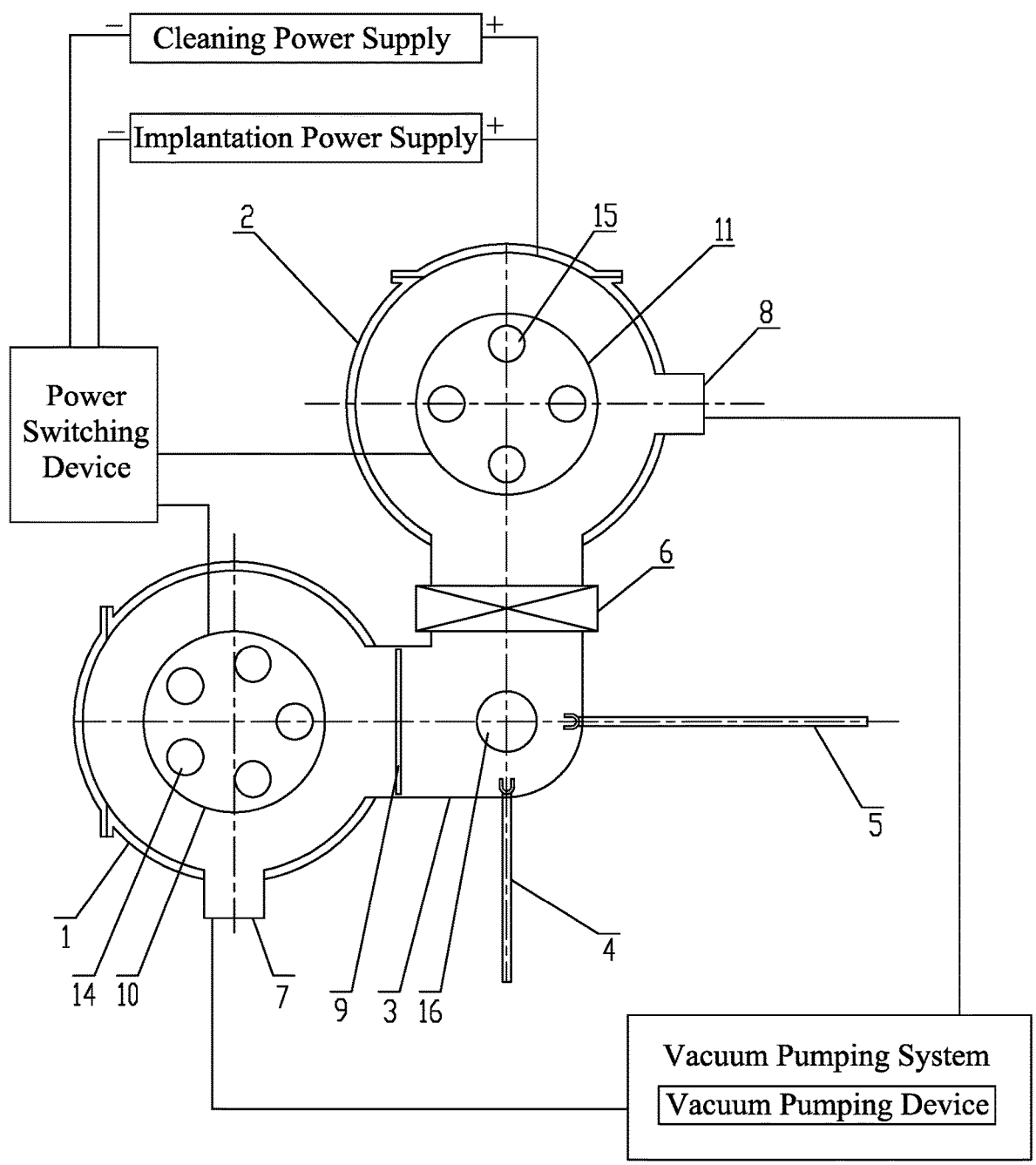
FIG. 3 is a top view of a plasma source ion implanter with a preparation chamber for cross transferring workpiece according to a second embodiment of the present invention.
Figure 4:
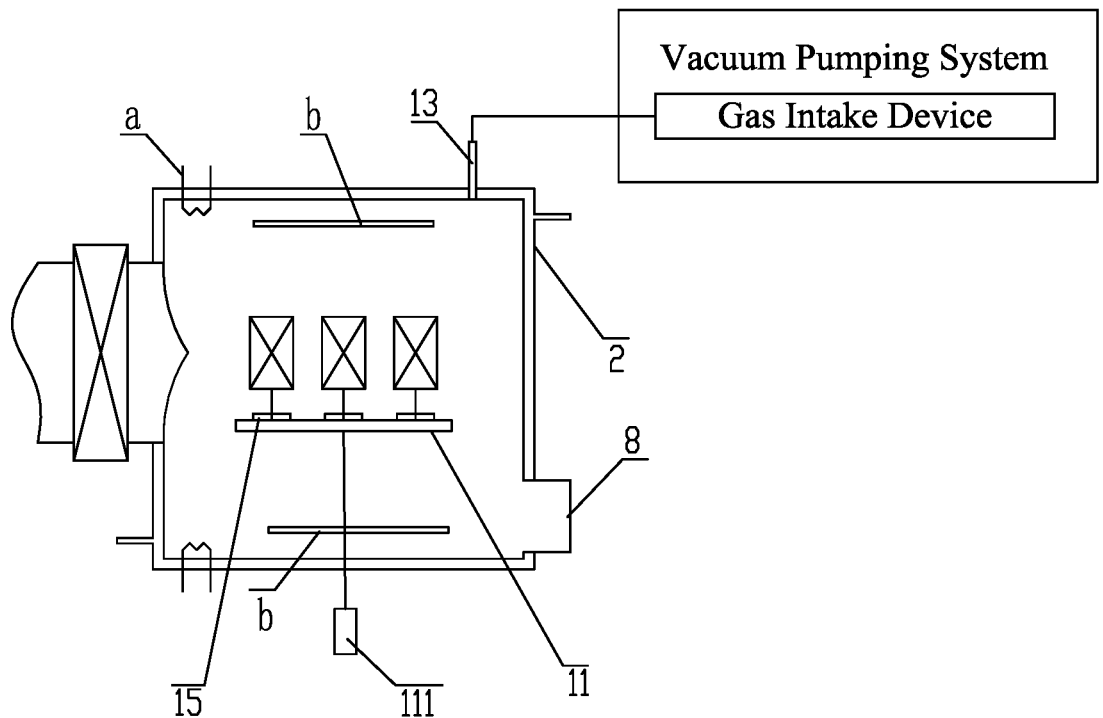
FIG. 4 is a sectional view of the plasma source ion implanter with the preparation chamber for cross transferring workpiece according to the second embodiment of the present invention, wherein a represents a radio frequency antenna and b represents a baking lamp.
Figure 5:
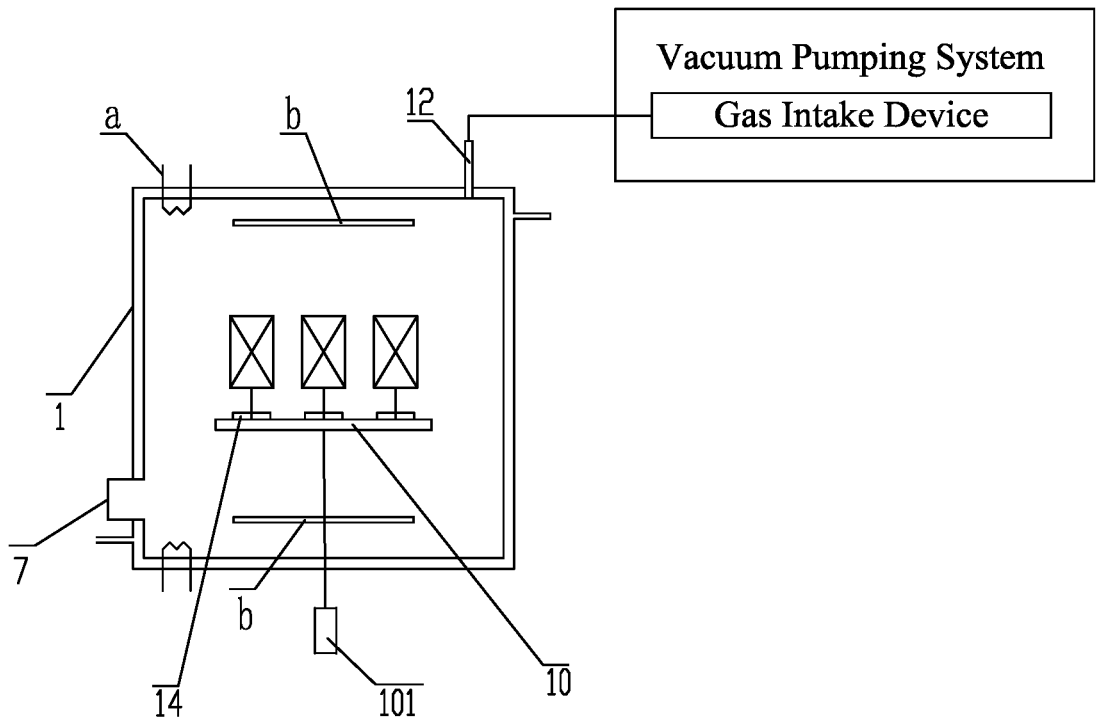
FIG. 5 is a top sectional view of the implantation chamber 2 in the plasma source ion implanter with the preparation chamber for cross transferring workpiece according to the second embodiment of the present invention, wherein a represents a radio frequency antenna and b represents a baking lamp.

Referring to FIGS. 3 to 5 of the drawings, a plasma source ion implanter with a preparation chamber for cross transferring workpiece according to this embodiment comprises a preparation chamber 1, an implantation chamber 2 and a workpiece transferring chamber 3.

The preparation chamber 1 is constructed with a double-layer wall, and a water inlet pipe and a water outlet pipe are arranged on the double-layer wall, wherein the preparation chamber 1 is operatively connected to a vacuum pumping system. The preparation chamber 1 is arranged for pre-vacuuming, degassing and surface ion cleaning of the workpiece. The ion implanter further comprises a first workbench 10 rotatably disposed in the preparation chamber 1, and a plurality of first stations 14 radially provided on the first workbench 10 at a position that the first stations 14 are arranged in a circular array. A power switching device has an output end connecting to the first workbench 10 via electrodes, and input ends respectively connecting with the negative poles of the cleaning power supply and the implantation power supply. The wall of the preparation chamber 1 is connected to the positive pole of the cleaning power supply and the implantation power supply, wherein a baking system and a radio frequency antenna are disposed in the preparation chamber 1. The radio frequency antenna is connected to the radio frequency power supply outside the preparation chamber 1. A first workbench drive motor 101 is located outside of the preparation chamber 1 for driving the first workbench 10 to rotate.

The above-mentioned vacuum pumping system, which is connected with the preparation chamber 1, comprises a vacuum pumping device and a gas intake device, wherein the vacuum pumping device is connected to a first exhaust outlet 7 provided on the preparation chamber 1, and the gas intake device is connected to a first gas inlet 12 provided on the preparation chamber 1. The first exhaust outlet 7 and the first gas inlet 12 are positioned opposite to each other to prevent the gas from short-circuiting. The gas intake device is arranged to deliver the working gas to the interior of the preparation chamber 1.

The implantation chamber 2 is also constructed with double-layer wall, and a water inlet pipe and a water outlet pipe are arranged on the double-layer wall, wherein the implantation chamber 2 is operatively connected to the vacuum pumping system. The implantation chamber 2 is arranged for ion implantation and maintaining high vacuum condition. The ion implanter further comprises a second workbench 11 rotatably disposed in the implantation chamber 2, and a plurality of second stations 15 radially provided on the second workbench 11 at a position that the second stations 15 are arranged in a circular array. The number of the second stations 15 on the implantation chamber 2 is less than the number of the first stations 14 on the preparation chamber 1. The second workbench 11 is connected with the output end of the power switching device via the electrodes, while the input ends of the power switching device are respectively connected with the negative poles of the cleaning power supply and the implantation power supply. The wall of the implantation chamber 2 is connected to the positive poles of the cleaning power supply and the implantation power supply, wherein the baking system and the radio frequency antenna are disposed at an upper portion of the implantation chamber 2. The radio frequency antenna is connected to the radio frequency power supply outside the implantation chamber 2. A second table drive motor 111 is located outside of the implantation chamber 2 for driving the second table 11 to rotate.

The above-mentioned vacuum pumping system, which is connected with the implantation chamber 2, comprises a vacuum pumping device and a gas intake device. The vacuum pumping device is connected with a second exhaust outlet 8 provided on the implantation chamber 2, and the gas intake device is connected with the second gas inlet 13 provided on the implantation chamber 2. The second exhaust outlet 8 and the second gas inlet 13 are positioned opposite to each other to prevent the gas from short-circuiting. The gas intake device is arranged to deliver the working gas to the interior of the implantation chamber 2.

The baking system disposed in the preparation chamber 1 and the implantation chamber 2 is arranged for baking and degassing the workpiece, and combining with ion bombardment cleaning to accelerate the degassing effect on the surface of the workpiece. The radio frequency antenna is arranged to excite plasma in the vacuum chamber, widen the discharge pressure range when cleaning the workpiece, reduce the difficulty of ion bombardment cleaning and discharge, reduce the phenomenon of arc discharge, and improve the cleaning quality. An ion source is provided for ion implantation during implantation. When the cleaning power supply is connected to the workbench, a glow discharge will be generated under the appropriate pressure wherein the glow discharge will cause gas ionization to form positive ions, which can bombard the workpiece at the cathode to generate a cleaning effect. When the implantation power supply is connected to the workbench, it is arranged to accelerate the positive ions in the plasma generated by the radio frequency power supply, and the high-energy ions enter the surface of the workpiece to achieve ion implantation.

The workpiece transferring chamber 3 is constructed to have two connecting chambers perpendicular to each other, wherein the preparation chamber 1 and the implantation chamber 2 are commutatively connected to the connecting chambers of the workpiece transferring chamber 3 respectively. The workpiece transferring chamber 3 comprises a first robotic arm 4, a second robotic arm 5, and a transferring platform 16. The first and second robotic arms 4, 5 are disposed in the connecting chambers of the workpiece transferring chamber 3 respectively and are positioned perpendicular to each other. The transferring platform 16 is located at the intersection of the two connecting chambers to align with the first and second robotic arms 4, 5 for temporarily carrying the workpiece when the first and second robotic arms 4, 5 exchange the workpiece. A vacuum gate valve 6 is provided between the workpiece transferring chamber 3 and the implantation chamber 2. A rotatable partition panel 9 is provided between the workpiece transferring chamber 3 and the preparation chamber 1, wherein the rotatable partition panel 9 is arranged for thermal insulation between the workpiece transferring chamber 3 and the preparation chamber 1.

The baking system is embodied as a baking lamp. The power switching device is a double throw knife switch. The cleaning power supply and the implantation power supply are spaced apart from each other to create enough space therebetween to prevent any breakdown. The output voltage of the cleaning power supply is 0-2 kV and the output voltage of the implantation power supply is 1-60 kV.

The method of ion implantation by using plasma source ion implanter with a preparation chamber for cross transferring workpiece comprises the following steps.

Step 1: Close an implantation chamber 2, close a vacuum gate valve 6, and pre-vacuum the implantation chamber 2 until a vacuum value thereof reaches at least $10^{-2}$ Pa, turn on a baking system in the implantation chamber 2 and pass hot water into a double-layer wall thereof for heating and degassing, and then vacuumize the implantation chamber 2 until a base vacuum value thereof reaches at least $10^{-4}$ Pa.

Step 2: While pre-evacuating the implantation chamber 2, open the preparation chamber 1 to place the workpiece.

Step 3: Workpiece preprocess:

Close a preparation chamber 1, pre-vacuum the preparation chamber 1 until a base vacuum value thereof reaches at least $10^{-2}$ Pa, turn on the baking system in the preparation chamber 1 and pass hot water into a double-layer wall thereof for heating and degassing, then vacuumize the preparation chamber 1 until the base vacuum value thereof is less than $5\times10^{-3}$ Pa, and feed working gas to the first gas inlet 12 through the gas intake device to a preset vacuum value. After the working gas is introduced, decrease the vacuum value, wherein the vacuum value is set to 1-100 Pa. Turn on a radio frequency power supply of the preparation chamber 1 to excite a radio frequency antenna to generate plasma, turn on a cleaning power supply corresponding to the preparation chamber 1 to form an ion bombardment cleaning. The cleaning power supply can form a negative voltage on the workpiece to accelerate the positive ions ionized in the vacuum and to bombard the surface of the workpiece with positive ions with energy, so as to remove the residual gas and pollutants adsorbed on the surface. After cleaning, stop feeding the working gas and continue to vacuum until the base vacuum value of the preparation chamber 1 is less than $5 \times 10^{-3}$ Pa.

Step 4: Connect the preparation chamber 1 and the implantation chamber 2:

After the preparation chamber 1 reaches the required base vacuum value, open the vacuum gate valve 6. Since the preparation chamber 1 and the implantation chamber 2 are both high vacuum condition at this time, there is no significant effect when the vacuum gate valve 6 is opened even though there is a difference in vacuum value therebetween.

Step 5: Transfer the workpiece:

Operate the first and second robotic arms 4, 5 to pick up workpiece and send the workpiece to the implantation chamber 2 through the vacuum gate valve 6, rotate the second workbench 11 in the implantation chamber 2 to place the workpiece in a proper position.

Step 6: Ion implantation:

Close the vacuum gate valve 6, continue to vacuum the implantation chamber 2 until the vacuum value in the implantation chamber 2 reaches the required base vacuum value, then introduce the working gas into the implantation chamber 2, turn on the radio frequency power supply and the implantation power supply corresponding to the implantation chamber 2 to perform ion implantation.

Step 7: Pre-cleaning a new batch of workpiece:

During the ion implantation in the implantation chamber 2, introduce the working gas into the preparation chamber 1 through the gas intake device, open the preparation chamber 1, reload a new batch of workpiece and preprocess the workpieces according to step 3.

Step 8: Ion implantation of the new batch of workpiece:

After the workpiece ion implantation in the implantation chamber 2 is completed, open the vacuum gate valve 6, operate the first and second robotic arms 4, 5 to replace the workpiece in the preparation chamber 1 and the implantation chamber 2. Since the number of stations in the preparation room 1 is more than that in the implantation room 2, the excess stations can be used as temporary stations for replacement.

Step 9: Close the vacuum gate valve 6 and perform the ion implantation in the implantation chamber 2.

Step 10: Inflate the preparation chamber 1, open the preparation chamber 1, take out the implanted workpiece, and put in a new workpiece.

The ion implanter with the dual-chamber configuration according to this embodiment has the following advantages:

1. It significantly shortens the production cycle: The main factor affecting the production cycle is pre-evacuation. The main purpose of pre-evacuation is to remove the residual gases in the vacuum chamber, wherein these gases come from the adsorption of air on the wall of the furnace when the furnace door is opened. Since oxygen molecules and water molecules in the air will release oxygen elements, the quality of the ion implantation layer will be decreased. During the plasma source ion implantation, one portion of the ions in the vacuum chamber are implanted into the surface of the workpiece while another portion of the ions will collide with the wall of the vacuum chamber to heat up the wall of the vacuum chamber, wherein the collision and heating of the ions will release residual oxygen and water molecules. Particularly, the water molecules adsorbed on the wall are difficult to be completely removed, wherein it needs to be baked for a long time at 150-250° C.

In this embodiment, the implantation chamber 2 is specially provided, wherein the implantation chamber 2 is always kept in a high vacuum condition, such that the time for pre-evacuating the back vacuum can be ignored. Since the ion implantation time is usually several hours, the process time is mainly determined by the implantation time. Therefore, the present invention greatly reduces the production cycle of ion implantation, and improves the efficiency by 2-4 times compared with the existing single vacuum chamber implanter.

The preparation chamber 1 is often exposed to the atmosphere, such that oxygen and water molecules are also released. Since the entire preparation chamber 1 does not need to be degassed, only the workpiece can be degassed. Under the working vacuum of preparation chamber 1, the workpiece is subjected to higher temperature baking and ion cleaning. The content of impurity gas on the surface of the workpiece can be greatly reduced in a short time.

2. The structural configurations of the preparation chamber 1 and the implantation chamber 2 are basically the same, and can be used independently when ion implantation is required for a long time. In other words, the preparation chamber 1 and the implantation chamber 2 can serve as two independent ion implanters respectively. The two vacuum chambers can be independently degassing, the ion cleaning and cross ion implantation. via an operation of the power switching device, one of the vacuum chambers is in a cleaning state while another vacuum chamber is in the implantation state.

3. The preparation chamber 1 is designed with at least one station more than the implantation chamber 2, wherein a robotic arm can be operated to complete the batch replacement of new and old workpiece at one time.

4. Hot water is used to heat the wall while iodine tungsten lamp is used to assist baking, therefore the process of gas removal of the gas inside the wall is accelerated.

5. During the ion cleaning by discharge of the radio frequency plasma, a plasma atmosphere in the vacuum chamber is formed. Using the negative potential formed on the wall of the radio frequency discharge, it can accelerate the ions to collide with the walls, accelerate the desorption of adsorbed gases, and improve the removal efficiency of impurity gas.

What is claimed is:

1. A plasma source ion implanter for linear transferring a workpiece comprises:
   a preparation chamber 1 being constructed with a double-layer wall, and a water inlet pipe and a water outlet pipe are arranged on the double-layer wall;
   a vacuum pumping system operatively connecting to the preparation chamber 1;
   a first workbench 10 rotatably disposed in the preparation chamber 1;
   a plurality of first stations 14 radially provided on the first workbench 10 at a position that the first stations 14 are arranged in a circular array;
   a first telescopic support member 18 having a rod shape, wherein an upper end portion of the first telescopic support rod 18 is extended to pass through a through hole formed at the first workbench 10 below the first station 14 to perpendicularly extend to the first workbench 10;

a power switching device having an output end connecting to the first workbench 10 via electrodes and input ends respectively connecting with negative poles of the cleaning power supply and the implantation power supply, wherein the wall of the preparation chamber 1 is connected to positive poles of the cleaning power supply and the implantation power supply;

a baking system and a radio frequency antenna are disposed in the preparation chamber 1, wherein the radio frequency antenna is connected to the radio frequency power supply outside the preparation chamber 1;

a first workbench drive motor 101 located outside of the preparation chamber 1 for driving the first workbench 10 to rotate;

an implantation chamber 2 being also constructed with the double-layer wall, and the water inlet pipe and the water outlet pipe are arranged on the double-layer wall, wherein the implantation chamber 2 is operatively connected to the vacuum pumping system;

a second workbench 11 rotatably disposed in the implantation chamber 2;

a plurality of second stations 15 radially provided on the second workbench 11 at a position that the second stations 15 are arranged in a circular array, wherein the number of the second stations 15 on the implantation chamber 2 is less than the number of the first stations 14 on the preparation chamber 1;

a second telescopic support member 19 having a rod shape, wherein an upper end portion of the second telescopic support rod 19 is extended to pass through a through hole formed at the second workbench 11 below the second station 15 to perpendicularly extend to the second workbench 11, wherein the second workbench 11 is connected with the output end of the power switching device via the electrodes, while the input ends of the power switching device are respectively connected with the negative poles of the cleaning power supply and the implantation power supply, wherein the wall of the implantation chamber 2 is connected to the positive poles of the cleaning power supply and the implantation power supply, wherein the baking system and the radio frequency antenna are disposed at an upper portion of the implantation chamber 2, wherein the radio frequency antenna is connected to the radio frequency power supply outside the implantation chamber 2;

a second table drive motor 111 located outside of the implantation chamber 2 for driving the second table 11 to rotate;

a workpiece transferring chamber 3, wherein the preparation chamber 1 and the implantation chamber 2 are connected with each other through the workpiece transferring chamber 3, wherein the preparation chamber 1 and the implantation chamber 2 are symmetrically arranged on two opposed sides of the workpiece transferring chamber 3, such that the preparation chamber 1 and the implantation chamber 2 are linearly aligned with each other;

a vacuum gate valve 6 operatively provided at a center of the workpiece transferring chamber 3;

first and second transferring platforms 20, 21 provided at a mid-portion of the workpiece transferring chamber 3, wherein the first transferring platform 20 is located at one side of the vacuum gate valve 6 while the second transferring platform 21 is located at the opposed side of the vacuum gate valve 6, such that the vacuum gate valve 6 is located between the first and second transferring platforms 20, 21 of the workpiece transferring chamber 3; and a transferring rod 17 provided on the left side of the preparation chamber 1, wherein the first telescopic support member 18 is provided below the first worktable 10 while the second telescopic support member 19 is provided below the second worktable 11.

2. The plasma source ion implanter, as recited in claim 1, wherein the vacuum pumping system is connected with the preparation chamber 1 and comprises a vacuum pumping device and a gas intake device, wherein the vacuum pumping device is connected to a first exhaust outlet 7 provided on the preparation chamber 1, and the gas intake device is connected to a first gas inlet 12 provided on the preparation chamber 1, wherein the first exhaust outlet 7 and the first gas inlet 12 are positioned opposite to each other to prevent the gas from short-circuiting, wherein the gas intake device is arranged to deliver the working gas to the interior of the preparation chamber 1;

wherein the vacuum pumping system is connected with the implantation chamber 2, wherein the vacuum pumping device is connected with a second exhaust outlet 8 provided on the implantation chamber 2, and the gas intake device is connected with the second gas inlet 13 provided on the implantation chamber 2, wherein the second exhaust outlet 8 and the second gas inlet 13 are positioned opposite to each other to prevent the gas from short-circuiting, wherein the gas intake device is arranged to deliver the working gas to the interior of the implantation chamber 2.

3. The plasma source ion implanter, as recited in claim 1, wherein the baking system is embodied as a baking lamp.

4. The plasma source ion implanter, as recited in claim 1, wherein the power switching device is a double throw knife switch, wherein an output voltage of the cleaning power supply is 0-2 kV and an output voltage of the implantation power supply is 1-60 kV.

5. The plasma source ion implanter, as recited in claim 1, which is performed by an implantation method comprising the steps of:

Step 1: closing the implantation chamber 2, closing the vacuum gate valve 6, pre-vacuuming the implantation chamber 2 until a vacuum value thereof reaches at least $10^{-2}$ Pa, turning on the baking system in the implantation chamber 2 and passing hot water into the double-layer wall thereof for heating and degassing, and then vacuumizing the implantation chamber 2 until a base vacuum value thereof reaches at least $10^{-4}$ Pa;

Step 2: while pre-evacuating the implantation chamber 2, opening the preparation chamber 1 to place the workpiece;

Step 3: workpiece preprocessing:

closing the preparation chamber 1, pre-vacuuming the preparation chamber 1 until a base vacuum value thereof reaches at least $10^{-2}$ Pa, turning on the baking system in the preparation chamber 1 and passing hot water into the double-layer wall thereof for heating and degassing, then vacuumizing the preparation chamber 1 until the base vacuum value thereof is less than $5\times10^{-3}$ Pa, and feeding working gas to the first gas inlet 12 through the gas intake device to a preset vacuum value, turning on the radio frequency power supply of the preparation chamber 1 to excite the radio frequency antenna to generate plasma, turning on the cleaning power supply corresponding to the preparation chamber 1 to form an ion bombardment cleaning, and after cleaning, stop feeding the working gas and continue to vacuum until the base vacuum value of the preparation chamber 1 is less than $5\times10^{-3}$ Pa;

Step 4: connecting the preparation chamber 1 and the implantation chamber 2:

after the preparation chamber 1 reaches the required base vacuum value, opening the vacuum gate valve 6;

Step 5: transferring the workpiece:

when transferring the workpiece, operating the first telescopic support member 18 or the second telescopic support member 19 to lift the workpiece on the first station 14 or the second station 15, then operating the transferring rod 17 to linearly move to extend a front end thereof under the workpiece, lowering the first telescopic support member 18 or the second telescopic support member 19, complete picking up the workpiece, and transferring the workpiece between the first station 14 and the second station 15;

Step 6: ion implantation:

closing the vacuum gate valve 6, continuously vacuuming the implantation chamber 2 until the vacuum value in the implantation chamber 2 reaches the required base vacuum value, then introducing the working gas into the implantation chamber 2, and turning on the radio frequency power supply and the implantation power supply corresponding to the implantation chamber 2 to perform ion implantation;

Step 7: pre-cleaning a new batch of workpiece:

during the ion implantation in the implantation chamber 2, introducing the working gas into the preparation chamber 1 through the gas intake device, opening the preparation chamber 1, and reloading the new batch of workpiece and preprocessing the workpieces according to step 3;

Step 8: ion implantation of the new batch of workpiece:

after the workpiece ion implantation in the implantation chamber 2 is completed, opening the vacuum gate valve 6, and operating the transferring rod 17 to linearly move to replace the workpiece in the preparation chamber 1 and the implantation chamber 2;

Step 9: closing the vacuum gate valve 6 and performing the ion implantation in the implantation chamber 2; and Step 10: inflating the preparation chamber 1, opening the preparation chamber 1, taking out the implanted workpiece, and putting in a new workpiece.

6. A plasma source ion implanter for cross transferring a workpiece comprises:

a preparation chamber 1 being constructed with a double-layer wall, and a water inlet pipe and a water outlet pipe are arranged on the double-layer wall;

a vacuum pumping system operatively connecting to the preparation chamber 1;

a first workbench 10 rotatably disposed in the preparation chamber 1;

a plurality of first stations 14 radially provided on the first workbench 10 at a position that the first stations 14 are arranged in a circular array;

a power switching device having an output end connecting to the first workbench 10 via electrodes and input ends respectively connecting with negative poles of the cleaning power supply and the implantation power supply, wherein the wall of the preparation chamber 1 is connected to positive poles of the cleaning power supply and the implantation power supply;

a baking system and a radio frequency antenna are disposed in the preparation chamber 1, wherein the radio frequency antenna is connected to the radio frequency power supply outside the preparation chamber 1;

a first workbench drive motor 101 located outside of the preparation chamber 1 for driving the first workbench 10 to rotate;

an implantation chamber 2 being also constructed with the double-layer wall, and the water inlet pipe and the water outlet pipe are arranged on the double-layer wall, wherein the implantation chamber 2 is operatively connected to the vacuum pumping system;

a second workbench 11 rotatably disposed in the implantation chamber 2;

a plurality of second stations 15 radially provided on the second workbench 11 at a position that the second stations 15 are arranged in a circular array, wherein the number of the second stations 15 on the implantation chamber 2 is less than the number of the first stations 14 on the preparation chamber 1, wherein the second workbench 11 is connected with the output end of the power switching device via the electrodes, while the input ends of the power switching device are respectively connected with the negative poles of the cleaning power supply and the implantation power supply, wherein the wall of the implantation chamber 2 is connected to the positive poles of the cleaning power supply and the implantation power supply, wherein the baking system and the radio frequency antenna are disposed at an upper portion of the implantation chamber 2, wherein the radio frequency antenna is connected to the radio frequency power supply outside the implantation chamber 2;

a second table drive motor 111 located outside of the implantation chamber 2 for driving the second table 11 to rotate;

a workpiece transferring chamber 3 constructed to have two connecting chambers perpendicular to each other, wherein the preparation chamber 1 and the implantation chamber 2 are commutatively connected to the connecting chambers of the workpiece transferring chamber 3 respectively;

first and second robotic arms 4, 5 are disposed in the connecting chambers of the workpiece transferring chamber 3 respectively and are positioned perpendicular to each other;

a transferring platform 16 located at the intersection of the two connecting chambers to align with the first and second robotic arms 4, 5 for temporarily carrying the workpiece when the first and second robotic arms 4, 5 exchange the workpiece;

a vacuum gate valve 6 provided between the workpiece transferring chamber 3 and the implantation chamber 2; and a rotatable partition panel 9 is provided between the workpiece transferring chamber 3 and the preparation chamber 1.

7. The plasma source ion implanter, as recited in claim 6, wherein the vacuum pumping system is connected with the preparation chamber 1 and comprises a vacuum pumping device and a gas intake device, wherein the vacuum pumping device is connected to a first exhaust outlet 7 provided on the preparation chamber 1, and the gas intake device is connected to a first gas inlet 12 provided on the preparation chamber 1, wherein the first exhaust outlet 7 and the first gas inlet 12 are positioned opposite to each other to prevent the gas from short-circuiting, wherein the gas intake device is arranged to deliver the working gas to the interior of the preparation chamber 1;

wherein the vacuum pumping system is connected with the implantation chamber 2, wherein the vacuum pumping device is connected with a second exhaust outlet 8 provided on the implantation chamber 2, and the gas intake device is connected with the second gas inlet 13 provided on the implantation chamber 2, wherein the second exhaust outlet 8 and the second gas inlet 13 are positioned opposite to each other to prevent the gas from short-circuiting, wherein the gas intake device is arranged to deliver the working gas to the interior of the implantation chamber 2.

8. The plasma source ion implanter, as recited in claim 6, wherein the baking system is embodied as a baking lamp.

9. The plasma source ion implanter, as recited in claim 6, wherein the power switching device is a double throw knife switch, wherein an output voltage of the cleaning power supply is 0-2 kV and an output voltage of the implantation power supply is 1-60 kV.

10. The plasma source ion implanter, as recited in claim 6, which is performed by an implantation method comprising the steps of:

Step 1: closing the implantation chamber 2, closing the vacuum gate valve 6, pre-vacuuming the implantation chamber 2 until a vacuum value thereof reaches at least $10^{-2}$ Pa, turning on the baking system in the implantation chamber 2 and passing hot water into the double-layer wall thereof for heating and degassing, and then vacuumizing the implantation chamber 2 until a base vacuum value thereof reaches at least $10^{-4}$ Pa;

Step 2: while pre-evacuating the implantation chamber 2, opening the preparation chamber 1 to place the workpiece;

Step 3: workpiece preprocessing:

closing the preparation chamber 1, pre-vacuuming the preparation chamber 1 until a base vacuum value thereof reaches at least $10^{-2}$ Pa, turning on the baking system in the preparation chamber 1 and passing hot water into the double-layer wall thereof for heating and degassing, then vacuumizing the preparation chamber 1 until the base vacuum value thereof is less than $5\times10^{-3}$ Pa, and feeding working gas to the first gas inlet 12 through the gas intake device to a preset vacuum value, turning on the radio frequency power supply of the preparation chamber 1 to excite the radio frequency antenna to generate plasma, turning on the cleaning power supply corresponding to the preparation chamber 1 to form an ion bombardment cleaning, and after cleaning, stop feeding the working gas and continue to vacuum until the base vacuum value of the preparation chamber 1 is less than $5\times10^{-3}$ Pa;

Step 4: connecting the preparation chamber 1 and the implantation chamber 2:

after the preparation chamber 1 reaches the required base vacuum value, opening the vacuum gate valve 6;

Step 5: transferring the workpiece:

operating the first and second robotic arms 4, 5 to pick up workpiece and sending the workpiece to the implantation chamber 2 through the vacuum gate valve 6, and rotating the second workbench 11 in the implantation chamber 2 to place the workpiece in a proper position;

Step 6: ion implantation:

closing the vacuum gate valve 6, continuously vacuuming the implantation chamber 2 until the vacuum value in the implantation chamber 2 reaches the required base vacuum value, then introducing the working gas into the implantation chamber 2, and turning on the radio frequency power supply and the implantation power supply corresponding to the implantation chamber 2 to perform ion implantation;

Step 7: pre-cleaning a new batch of workpiece:

during the ion implantation in the implantation chamber 2, introducing the working gas into the preparation chamber 1 through the gas intake device, opening the preparation chamber 1, and reloading the new batch of workpiece and preprocessing the workpieces according to step 3;

Step 8: ion implantation of the new batch of workpiece:

after the workpiece ion implantation in the implantation chamber 2 is completed, opening the vacuum gate valve 6, operating the first and second robotic arms 4, 5 to replace the workpiece in the preparation chamber 1 and the implantation chamber 2;

Step 9: closing the vacuum gate valve 6 and performing the ion implantation in the implantation chamber 2; and Step 10: inflating the preparation chamber 1, opening the preparation chamber 1, taking out the implanted workpiece, and putting in a new workpiece.

\* \* \* \* \*